US012631967B2

(12) United States Patent
Park et al.

(10) Patent No.: US 12,631,967 B2
(45) Date of Patent: May 19, 2026

(54) SUBSTRATE PROCESSING APPARATUS AND SUBSTRATE PROCESSING METHOD

(71) Applicant: Samsung Electronics Co., Ltd., Suwon-si (KR)

(72) Inventors: Sangjine Park, Suwon-si (KR); Jihwan Park, Suwon-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 371 days.

(21) Appl. No.: 18/120,916

(22) Filed: Mar. 13, 2023

(65) Prior Publication Data

US 2024/0036476 A1 Feb. 1, 2024

(30) Foreign Application Priority Data

Jul. 26, 2022 (KR) ........................ 10-2022-0092647

(51) Int. Cl.
*G03F 7/00* (2006.01)
*H01J 37/32* (2006.01)
(52) U.S. Cl.
CPC ...... *G03F 7/70033* (2013.01); *H01J 37/3244* (2013.01); *H01J 37/32458* (2013.01); *H01J 37/32715* (2013.01)
(58) Field of Classification Search
None
See application file for complete search history.

(56) References Cited

U.S. PATENT DOCUMENTS

| | | | | |
|---|---|---|---|---|
| 4,949,671 | A | * | 8/1990 | Davis ................. H01J 37/3244 118/725 |
| 6,737,812 | B2 | * | 5/2004 | Yuasa ............... H01J 37/32366 315/111.21 |
| 9,362,137 | B2 | * | 6/2016 | Kang ................ H01J 37/32192 |

(Continued)

FOREIGN PATENT DOCUMENTS

| | | | | |
|---|---|---|---|---|
| CN | 113130357 A | * | 7/2021 | .............. H10P 90/12 |
| CN | 113983763 A | * | 1/2022 | ................ F26B 1/00 |

(Continued)

OTHER PUBLICATIONS

English machine translation for KR-102164247-B1 (Year: 2020).*

(Continued)

*Primary Examiner* — Robert H Kim
*Assistant Examiner* — Alina Kaliszewski
(74) *Attorney, Agent, or Firm* — Muir Patent Law, PLLC

(57) ABSTRACT

Provided is a substrate processing apparatus including a processing chamber including a processing space, a substrate support configured to support a substrate in the processing chamber, an exhaust pipe arranged on a bottom wall of the processing chamber, an exhaust device configured to exhaust a fluid in the processing space via the exhaust pipe, a first supply pipe including a first portion inserted into the exhaust pipe and a second portion outside the exhaust pipe, and a fluid supply device configured to supply a fluid in a supercritical state to the processing space via the first supply pipe, wherein a first inlet at an end portion of the first supply pipe and an exhaust opening at an end portion of the exhaust pipe are on a central axis of the processing chamber.

20 Claims, 16 Drawing Sheets

100

(56) References Cited

U.S. PATENT DOCUMENTS

| | | | | |
|---|---|---|---|---|
| 10,197,333 | B2 * | 2/2019 | Kim | F26B 3/04 |
| 10,957,529 | B2 * | 3/2021 | Lee | H10P 70/20 |
| 11,117,161 | B2 | 9/2021 | Lee | |
| 11,305,485 | B2 | 4/2022 | Egmond | |
| 2004/0231799 | A1 * | 11/2004 | Lee | C23C 16/5096 |
| | | | | 156/345.34 |
| 2005/0001527 | A1 * | 1/2005 | Sugiyama | H01J 37/32082 |
| | | | | 315/111.21 |
| 2007/0209759 | A1 * | 9/2007 | Miya | H01J 37/3244 |
| | | | | 156/345.35 |
| 2009/0042321 | A1 * | 2/2009 | Sasaki | H01J 37/32412 |
| | | | | 257/E21.531 |
| 2009/0301656 | A1 * | 12/2009 | Nishimoto | H01J 37/3222 |
| | | | | 118/723 AN |
| 2010/0180819 | A1 * | 7/2010 | Hatanaka | C23C 16/452 |
| | | | | 118/719 |
| 2011/0247662 | A1 * | 10/2011 | Kamikawa | H10P 72/0416 |
| | | | | 134/105 |
| 2012/0115314 | A1 * | 5/2012 | Sakamoto | C23C 16/24 |
| | | | | 438/479 |
| 2013/0025155 | A1 * | 1/2013 | Kim | H01L 21/67109 |
| | | | | 34/516 |
| 2013/0145640 | A1 * | 6/2013 | Lee | H10P 72/0408 |
| | | | | 34/201 |
| 2014/0262024 | A1 * | 9/2014 | Cho | H01L 21/67051 |
| | | | | 156/345.1 |
| 2017/0009338 | A1 * | 1/2017 | Saito | H01J 37/32119 |
| 2018/0366349 | A1 * | 12/2018 | Cho | H01L 21/67126 |
| 2019/0131164 | A1 * | 5/2019 | Kim | H01L 21/67017 |
| 2019/0323126 | A1 * | 10/2019 | Sung | C23C 16/45565 |
| 2020/0241425 | A1 * | 7/2020 | Ueda | G03F 7/20 |
| 2021/0020462 | A1 * | 1/2021 | Jeong | H10P 72/0414 |
| 2022/0008964 | A1 * | 1/2022 | Choi | B08B 7/0021 |
| 2022/0020609 | A1 | 1/2022 | Park et al. | |

FOREIGN PATENT DOCUMENTS

| | | | | | |
|---|---|---|---|---|---|
| KR | 20040076217 | A | * | 8/2004 | H10P 50/242 |
| KR | 20140032195 | A | * | 3/2014 | H10P 72/0468 |
| KR | 10-1540409 | B1 | | 7/2015 | |
| KR | 10-1681190 | B1 | | 12/2016 | |
| KR | 102099886 | B1 | * | 4/2020 | H01L 21/67109 |
| KR | 102164247 | B1 | * | 10/2020 | H01L 21/67034 |
| KR | 10-2258986 | B1 | | 6/2021 | |
| KR | 1020220006385 | A | | 1/2022 | |
| KR | 10-2376957 | B1 | | 3/2022 | |
| KR | 1020220094239 | A | | 7/2022 | |
| KR | 20230059550 | A | * | 5/2023 | H01J 37/32862 |

OTHER PUBLICATIONS

English machine translation for CN-113983763-A (Year: 2022).*
English machine translation for KR-20040076217-A (Year: 2004).*
English machine translation for KR-20140032195-A (Year: 2014).*
English machine translation for KR-102099886-B1 (Year: 2020).*
English machine translation for CN-113130357-A (Year: 2021).*
English machine translation for KR-20230059550-A (Year: 2023).*

* cited by examiner

SUBSTRATE PROCESSING APPARATUS AND SUBSTRATE PROCESSING METHOD

CROSS-REFERENCE TO RELATED APPLICATION

This application is based on and claims priority under 35 U.S.C. § 119 to Korean Patent Application No. 10-2022-0092647, filed on Jul. 26, 2022 in the Korean Intellectual Property Office, the disclosure of which is incorporated by reference herein in its entirety.

BACKGROUND

The inventive concept relates to a substrate processing apparatus and a substrate processing method.

As semiconductor devices are required to be fine, an extreme ultra-violet (EUV) lithography method using a short wavelength (about 13.5 nm) has been proposed. By using the EUV lithography, a photoresist pattern having a small horizontal dimension and a high aspect ratio may be formed. Supercritical fluids have been considered and examined in the semiconductor device manufacturing technology to prevent photoresist patterns from collapsing during a process of forming a fine photoresist pattern, but there are some issues, for example, particle defects remaining on a substrate during the manufacturing process of a semiconductor device.

SUMMARY

The inventive concept provides a substrate processing apparatus for improving uniformity of a substrate processing.

According to an aspect of the inventive concept, there is provided a substrate processing apparatus including a processing chamber including a processing space, a substrate support configured to support a substrate in the processing chamber, an exhaust pipe arranged on a bottom wall of the processing chamber, an exhaust device configured to exhaust a fluid in the processing space via the exhaust pipe, a first supply pipe including a first portion inserted into the exhaust pipe and a second portion outside the exhaust pipe, and a fluid supply device configured to supply a processing fluid in a supercritical state to the processing space via the first supply pipe, wherein a first inlet at an end portion of the first supply pipe and an exhaust opening at an end portion of the exhaust pipe are on a central axis of the processing chamber.

According to another aspect of the inventive concept, there is provided a substrate processing apparatus including a processing chamber including a processing space, a substrate support configured to support a substrate in the processing chamber, a first supply pipe arranged inside a mounting hole of a bottom wall of the processing chamber, and including a first inlet configured to inject a processing fluid in a supercritical state into the processing space, and an exhaust pipe arranged inside the mounting hole of the bottom wall of the processing chamber, and configured to exhaust a fluid in the processing space, wherein any one of the first supply pipe and the exhaust pipe is inserted into the other.

According to another aspect of the inventive concept, there is provided a substrate processing method including loading a substrate into a processing space of a processing chamber, supplying a processing fluid in a supercritical state into the processing chamber via at least one of a first supply pipe provided in a bottom wall of the processing chamber and a second supply pipe provided in an upper wall of the processing chamber, and exhausting a fluid in the processing chamber via an exhaust pipe provided on the bottom wall of the processing chamber, wherein the first supply pipe includes a first portion inserted into the exhaust pipe and a second portion outside the exhaust pipe.

BRIEF DESCRIPTION OF THE DRAWINGS

Embodiments will be more clearly understood from the following detailed description taken in conjunction with the accompanying drawings in which:

FIG. 1 is a cross-sectional view of a substrate processing apparatus according to an embodiment;

FIG. 10 is a cross-sectional view of a substrate processing apparatus according to an embodiment;

DETAILED DESCRIPTION OF THE EMBODIMENTS

Figure 2:
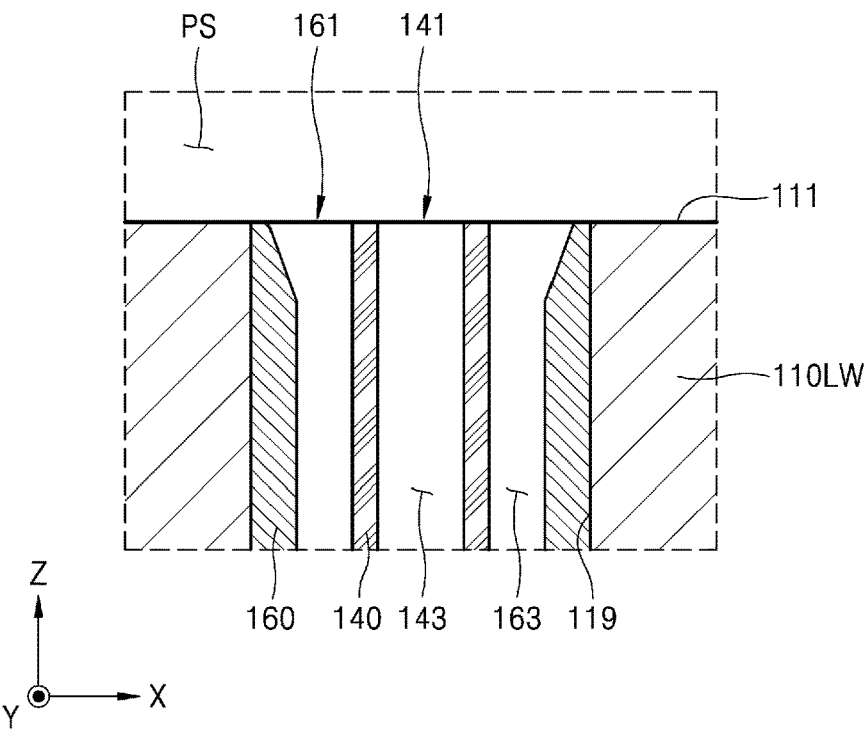
FIG. 2 is an enlarged cross-sectional view of a region designated as 'II' in FIG. 1.

Hereinafter, embodiments of the inventive concept are described in detail with reference to the accompanying drawings. Identical reference numerals are used for the same constituent elements in the drawings, and duplicate descriptions thereof are omitted.

Figure 1:
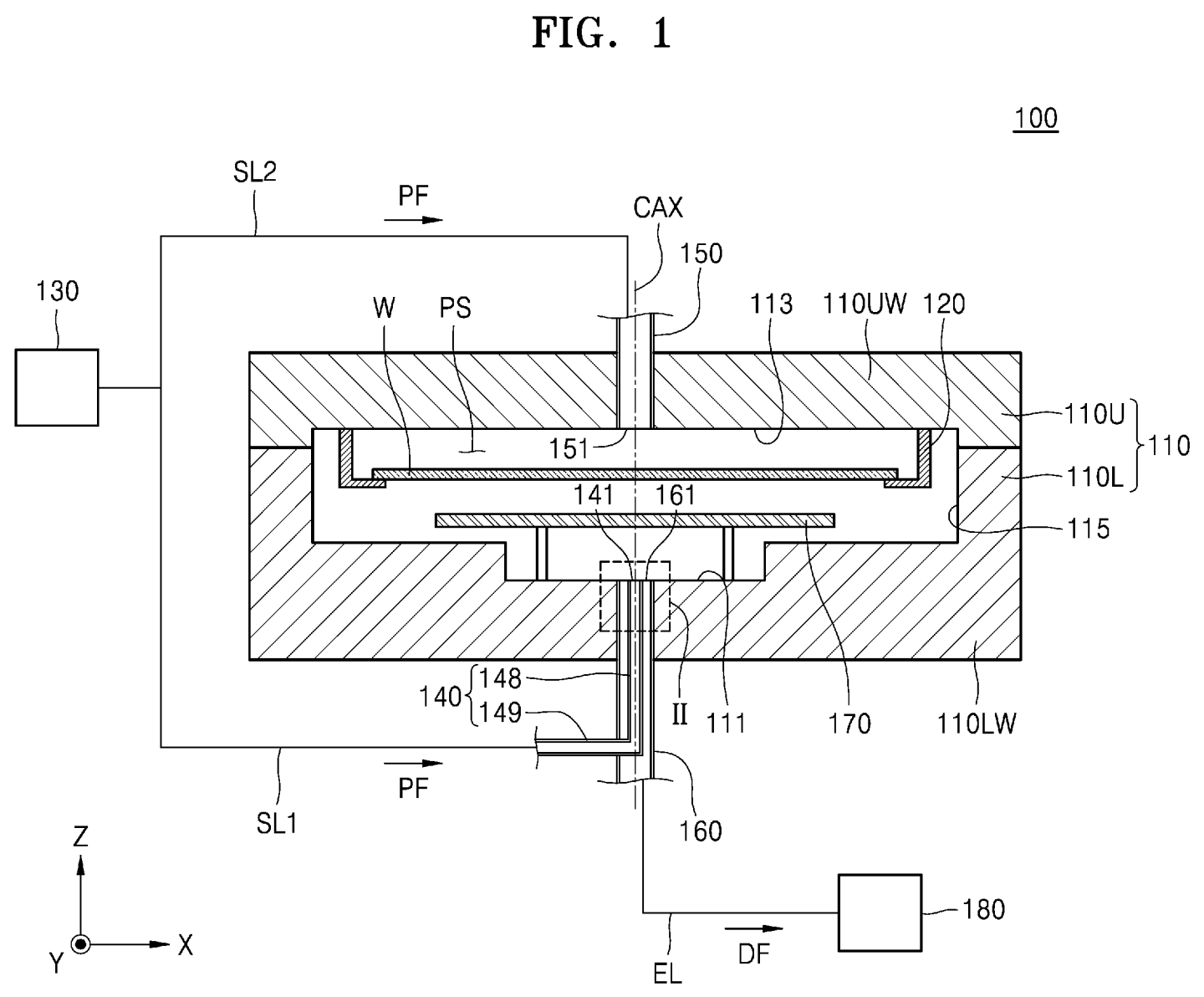
Figure 3:
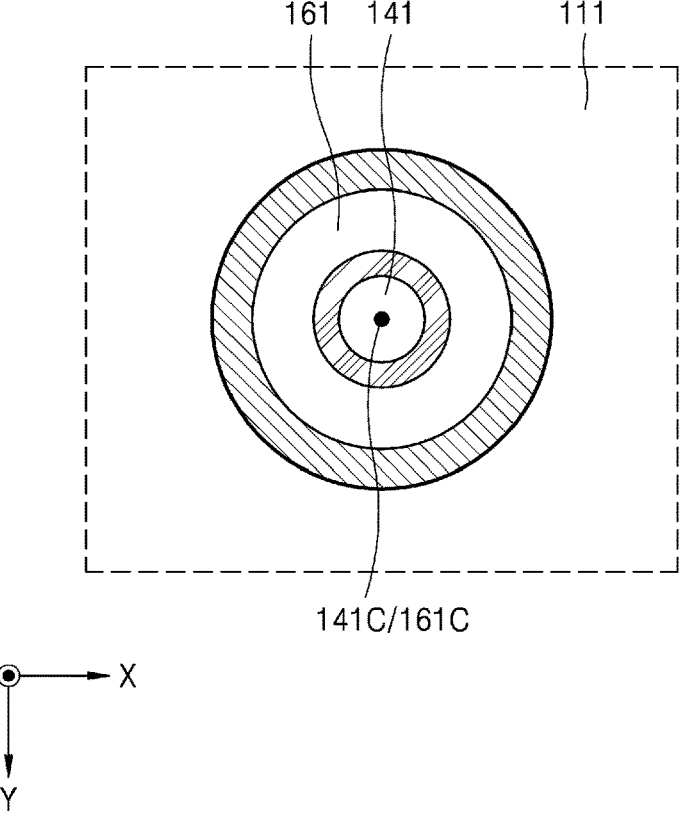
FIG. 3 is a plan view of a first supply pipe and an exhaust pipe exposed through a bottom surface of a processing chamber.

FIG. 1 is a cross-sectional view of a substrate processing apparatus 100 according to an embodiment. FIG. 2 is an enlarged cross-sectional view of a region designated as 'II' in FIG. 1. FIG. 3 is a plan view of a first supply pipe 140 and an exhaust pipe 160, which are exposed via a bottom surface 111 of a processing chamber 110.

Referring to FIGS. 1 through 3, the substrate processing apparatus 100 may include the processing chamber 110, a substrate support 120, a fluid supply device 130, the first supply pipe 140, a second supply pipe 150, the exhaust pipe 160, and a blocking plate 170, and an exhaust device 180.

The processing chamber 110 may provide a processing space PS for processing a substrate W. The processing chamber 110 may seal/isolate the processing space PS from the outside, while the substrate W is processed. The processing space PS may be defined by the bottom surface 111, an upper surface 113, and side surfaces 115 of the processing chamber 110. For example, the processing space PS may be defined by a bottom wall 110LW of the processing chamber 110 including the bottom surface 111 of the processing chamber 110, an upper wall 110UW of the processing chamber 110 including the upper surface 113 of the processing chamber 110, and sidewalls of the processing chamber 110 defining/including side surfaces 115 of the processing chamber 110.

In some embodiments, the processing space PS may have a symmetrical shape and may be symmetrical with respect to a central axis CAX of the processing chamber 110. For example, the central axis CAX may be a central axis vertically extending and passing through a center of the processing chamber 110. For example, the processing space PS may have a rotational symmetrical shape (e.g., may have a rotational symmetry) with respect to the central axis CAX of the processing chamber 110. For example, the processing chamber 110 and the processing space PS may have a symmetrical shape or a mirror shape with respect to an arbitrary reference plane. For example, the processing chamber 110 and the processing space PS may have a mirror symmetry.

The processing chamber 110 may include a lower body 110L and an upper body 110U. The upper body 110U may be arranged/disposed on the lower body 110L. Each of the upper body 110U and the lower body 110L may include or be formed of, for example, a metal. For example, the upper body 110U may be coupled onto the lower body 110L to cover a space provided by the lower body 110L. The upper body 110U and the lower body 110L may be switched between a closed position for sealing the processing space PS (e.g., isolating the processing space PS from the outside) and an open position for opening the processing space PS to the atmosphere outside the processing chamber 110. At the closed position of the processing chamber 110, the upper body 110U may be coupled onto (e.g., contact) the lower body 110L to seal the processing space PS (e.g., to isolate the processing space PS from the outside). At the open position of the processing chamber 110, the upper body 110U may be spaced apart from the lower body 110L, and the processing space PS may be open to the atmosphere outside the processing chamber 110. Switching between the closed position and the open position of the processing chamber 110 may be implemented by using an elevating device configured to move the upper body 110U in a vertical direction (for example, Z direction) with respect to the lower body 110L.

The substrate support 120 may be provided in the processing space PS, and may support the substrate W. The substrate support 120 may support the substrate W so that an upper surface of the substrate W faces the upper surface 113 of the processing chamber 110 and a lower surface of the substrate W faces the bottom surface 111 of the processing chamber 110. The upper surface of the substrate W may include a surface to be processed by using the substrate processing apparatus 100. The substrate support 120 may support the substrate W so that the center of the upper surface of the substrate W is aligned with the central axis CAX of the processing chamber 110.

The substrate support 120 may be coupled onto the upper wall 110UW of the processing chamber 110, and may support an edge portion of the substrate W. For example, the substrate support 120 may include a vertical rod extending downward from the upper surface 113 of the processing chamber 110, and a horizontal rod extending in a horizontal direction (for example, X direction and/or Y direction) from one end (e.g., a lower end) of the vertical rod. For example, the upper wall 110UW may be a structure forming the upper surface (e.g., ceiling) 113 of the processing chamber 110. The horizontal rod may contact and support an outer region (e.g., an edge) of the lower surface of the substrate W, e.g., when the substrate W is loaded on the substrate support 120. For example, the substrate support 120 may be fixed to the upper body 110U, and stably support the substrate W, while the upper body 110U moves up and down.

The fluid supply device 130 may generate a processing fluid PF for processing the substrate W, and supply the generated processing fluid PF to the processing space PS of the processing chamber 110. In embodiments, the fluid supply device 130 may be configured to generate and supply a supercritical fluid, and the substrate processing apparatus 100 may be configured to use a supercritical fluid to process the substrate W. For example, the substrate processing apparatus 100 may be configured to perform a drying process on the substrate W by using a supercritical fluid.

Physical properties, such as density, viscosity, a diffusion coefficient, polarity, or the like of the supercritical fluid may continuously/gradually change from a gas-like state to a liquid-like state according to a change in pressure, e.g., as a pressure of the supercritical fluid changes gradually. The supercritical fluid may include a material having a temperature equal to or greater than a critical temperature and a pressure equal to or greater than a critical pressure, and may have diffusivity, viscosity, and surface tension in a gas-like state, and may also have solubility in a liquid-like state. When a drying process is performed on the substrate W by using a supercritical fluid, the supercritical fluid having little surface tension may penetrate into a fine groove provided on the substrate W, and may dry a cleaning solution and/or a rinse solution on the substrate W, while suppressing a leaning phenomenon or water spots, which may occur on the substrate W, e.g., in traditional processes.

For example, the supercritical fluid may include or be formed of carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), or a combination thereof. In some embodiments, the fluid supply device 130 may be configured to generate and supply a supercritical fluid containing carbon dioxide. Because carbon dioxide has a low critical temperature and critical pressure of about 31° C. and about 73 bar, respectively, and is non-toxic, non-flammable, and relatively inexpensive, the carbon dioxide may be easily used for drying the substrate W.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The fluid supply device 130 may be configured to supply the processing fluid PF to the processing space PS of the processing chamber 110 via at least one of the first supply pipe 140 arranged on the bottom wall 110LW of the processing chamber 110 and the second supply pipe 150 arranged on the upper wall 110UW of the processing chamber 110. The bottom wall 110LW of the processing chamber 110 may be a structure forming the bottom surface 111 of the processing chamber 110.

The first supply pipe 140 may extend in the bottom wall 110LW of the processing chamber 110. The first supply pipe 140 may extend downward from the bottom surface 111 of the processing chamber 110. For example, the first supply pipe 140 may be arranged/disposed in a mounting hole 119 of the bottom wall 110LW of the processing chamber 110. The first supply pipe 140 may include a first supply flow path 143 connected to the processing space PS such that the processing fluid PF may flow into the processing space PS through the first supply flow path 143, and a first inlet 141 may be provided at one end of the first supply flow path 143 (e.g., an end exposed toward the processing space PS). The first supply flow path 143 of the first supply pipe 140 may be connected to the fluid supply device 130 via a first supply line SL1 such that the processing fluid PF provided by the fluid supply device 130 is provided to the first supply flow path 143 of the first supply pipe 140 via the first supply line SL1, and an on/off valve for controlling the supply of the processing fluid PF to the first supply pipe 140 may be installed on the first supply line SL1. The processing fluid PF may be injected/provided into the processing space PS via the first inlet 141 of the first supply pipe 140. In some embodiments, the first inlet 141 may have a circular or elliptical shape in a plan view. In some embodiments, the first inlet 141 may also have a polygonal shape, such as a quadrangle, in a plan view.

The second supply pipe 150 may extend in/through the upper wall 110UW of the processing chamber 110. The second supply pipe 150 may extend upward from the upper surface 113 of the processing chamber 110. For example, the second supply pipe 150 may be inserted into a mounting hole of the upper wall 110UW of the processing chamber 110. The second supply pipe 150 may include/provide a second supply flow path connected to the processing space PS such that the processing fluid PF may flow into the processing space SP-PS through the second supply flow path, and a second inlet 151 may be provided at one end of the second supply flow path (e.g., an end exposed toward the processing space PS). The second supply flow path of the second supply pipe 150 may be connected to the fluid supply device 130 via a second supply line SL2 such that the processing fluid PF provided by the fluid supply device 130 is provided to the second supply flow path of the second supply pipe 150 via the second supply line SL2, and an on/off valve for controlling the supply of the processing fluid PF to the second supply pipe 150 may be installed on the second supply line SL2. The processing fluid PF may be injected/provided into the processing space PS via the second inlet 151 of the second supply pipe 150. In some embodiments, the second inlet 151 may have a circular or elliptical shape in a plan view. In some embodiments, the second inlet 151 may also have a polygonal shape, such as a quadrangle, in a plan view.

The exhaust device 180 may be configured to discharge a discharge fluid DF from the processing space PS to the outside of the processing chamber 110. The exhaust device 180 may be connected to the exhaust pipe 160 arranged in the bottom wall 110LW of the processing chamber 110 via an exhaust line EL such that the discharge fluid DF in the processing chamber 110 is removed from the processing chamber 110 via the exhaust pipe 160 and the exhaust line EL to the exhaust device 180. For example, the exhaust device 180 may be configured to discharge the discharge fluid DF in the processing space PS to the outside of the processing chamber 110 via the exhaust pipe 160. In this case, the discharge fluid DF may be a fluid including various gases, chemicals, by-products, particles, the processing fluid PF, or the like in the processing space PS. The discharge fluid DF may be discharged from the processing space PS via the exhaust pipe 160. The exhaust device 180 may include a vacuum pump, a recovery unit for recovering the discharge fluid DF, an on/off valve (181 in FIG. 4) installed on the exhaust line EL, a flowmeter installed on the exhaust line EL, etc. For example, to perform an exhaust operation by using the exhaust device 180, the vacuum pump may reduce the pressure in the exhaust pipe 160, and suck the discharge fluid DF in the processing space PS into the exhaust pipe 160. Furthermore, the exhaust device 180 may be configured to control the pressure in the processing space PS by sucking and removing the discharge fluid DF from the processing space PS.

The exhaust pipe 160 may extend in/through the bottom wall 110LW of the processing chamber 110. The exhaust pipe 160 may extend downward from the bottom surface 111 of the processing chamber 110. For example, the exhaust pipe 160 may be arranged/inserted in the mounting hole 119 of the bottom wall 110LW of the processing chamber 110. The exhaust pipe 160 may include an exhaust flow path 163 connected to the processing space PS such that the discharge fluid DF flows from the processing space SP to the exhaust flow path 163, and an exhaust opening 161 may be provided at one end of the exhaust flow path 163 (e.g., an end exposed toward the processing space PS). The exhaust flow path 163 of the exhaust pipe 160 may be connected to the exhaust device 180 via the exhaust line EL such that the discharge fluid DF flows from the exhaust flow path 163 of the exhaust pipe 160 to the exhaust device 180 through the exhaust line EL. By performing the exhaust operation of the exhaust device 180, the discharge fluid DF in the processing space PS may be sucked into the exhaust pipe 160. In some embodiments, the exhaust opening 161 may have a circular or elliptical shape in a plan view. In some embodiments, the exhaust opening 161 may also have a polygonal shape, such as a quadrangle, in a plan view.

In some embodiments, a portion of the first supply pipe 140 may extend in the exhaust pipe 160. For example, the first supply pipe 140 may be inserted into the exhaust pipe 160 via a through hole of the exhaust pipe 160. The first supply pipe 140 may include a first portion 148 inserted into the exhaust pipe 160 and a second portion 149 outside the exhaust pipe 160. The first portion 148 of the first supply pipe 140 may be adjacent to the processing space PS (e.g., the first portion 148 of the first supply pipe 140 may be closer than the second portion 149 of the first supply pipe 140 to the processing space PS), and include the first inlet 141. Because the first portion 148 of the first supply pipe 140 is inserted into the exhaust pipe 160, an outer diameter of the first portion 148 of the first supply pipe 140 may be less than an inner diameter of the exhaust pipe 160. For example, the outer diameter of the first portion 148 of the first supply pipe 140 may be a diameter of a circumference formed by an overlapping line (curve/circle) between a horizontal plane and an outer surface of the first portion 148 of the first supply pipe 140, and the inner diameter of the exhaust pipe 160 may be a diameter of a circumference formed by an overlapping line (curve/circle) between a horizontal plane and an inner surface of the exhaust pipe 160. In a section where the first portion 148 of the first supply pipe 140 is inserted in the exhaust pipe 160, the exhaust flow path 163 of the exhaust pipe 160 may be defined as a space between an inner surface of the exhaust pipe 160 and an outer surface of the first supply pipe 140. The diameter of the first supply flow path 143 of the first supply pipe 140 may be less than the diameter or width of the exhaust flow path 163 of the exhaust pipe 160.

The first supply pipe 140 may extend downward from the bottom surface 111 of the processing chamber 110 along the exhaust pipe 160. The second portion 149 of the first supply pipe 140 may be connected to the first supply line SL1 such that the processing fluid PF flows from the first supply line SL1 to the first portion 148 of the first supply pipe 140 through the second portion 149 of the first supply pipe 140. As the first portion 148 of the first supply pipe 140 is inserted into the exhaust pipe 160, a double pipe structure may be formed. For example, the double pipe structure may be a structure in which a pipe is inserted in another pipe, e.g., in a concentric arrangement.

In some embodiments, one end of the first supply pipe 140 may be at substantially the same level as one end of the exhaust pipe 160. For example, the end of the first supply pipe 140 and the end of the exhaust pipe 160 may be at the same level as the bottom surface 111 of the processing chamber 110. In some embodiments, the first supply pipe 140 may protrude from the end of the exhaust pipe 160, or the exhaust pipe 160 may also protrude from the end of the first supply pipe 140. In some embodiments, the first supply pipe 140 may be configured to be relatively movable with respect to the exhaust pipe 160, and by using the movement of the first supply pipe 140, the distance between the end of the first supply pipe 140 and the end of the exhaust pipe 160 may also be adjusted.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first inlet 141 of the first supply pipe 140 may overlap the exhaust opening 161 of the exhaust pipe 160 vertically or in a vertical direction (for example, the Z direction). In a plan view, the first inlet 141 of the first supply pipe 140 may be inside the exhaust opening 161 of the exhaust pipe 160. In some embodiments, a center 141C of the first inlet 141 of the first supply pipe 140 may be inside the exhaust opening 161 of the exhaust pipe 160. In some embodiments, a center 161C of the exhaust opening 161 of the exhaust pipe 160 may be inside the first inlet 141 of the first supply pipe 140. In some embodiments, the center 161C of the exhaust opening 161 of the exhaust pipe 160 and the center 141C of the first inlet 141 of the first supply pipe 140 may be aligned (e.g., overlap) in a vertical direction (for example, the Z direction). In some embodiments, the center 161C of the exhaust opening 161 of the exhaust pipe 160 and the center 141C of the first inlet 141 of the first supply pipe 140 may be aligned along or placed on a central axis CAX of the processing chamber 110.

Furthermore, the second inlet 151 of the second supply pipe 150 may overlap the first inlet 141 of the first supply pipe 140 and/or the exhaust opening 161 of the exhaust pipe 160 in a vertical direction (for example, the Z direction). In a plan view, the center of the second inlet 151 of the second supply pipe 150 may be inside the first inlet 141 of the first supply pipe 140 and/or the exhaust opening 161 of the exhaust pipe 160. In some embodiments, the center 161C of the exhaust opening 161 of the exhaust pipe 160, the center 141C of the first inlet 141 of the first supply pipe 140, and the center of the second inlet 151 of the second supply pipe 150 may be aligned (e.g., overlap) in a vertical direction (for example, the Z direction). In some embodiments, the center 161C of the exhaust opening 161 of the exhaust pipe 160, the center 141C of the first inlet 141 of the first supply pipe 140, and the center of the second inlet 151 of the second supply pipe 150 may be on or aligned along the central axis CAX of the processing chamber 110.

The blocking plate 170 may be arranged/disposed between the bottom surface 111 of the processing chamber 110 and the substrate W supported by the substrate support 120. For example, the blocking plate 170 may be placed at a level between a level of the bottom surface 111 of the processing chamber 110 and a level of the substrate support 120. The blocking plate 170 may have a shape corresponding or similar to the substrate W, for example, a circular plate shape, e.g., a disc shape. The blocking plate 170 may be supported by a support column built on the bottom surface 111 of the processing chamber 110, and may be spaced apart by a preset distance from the bottom surface 111 of the processing chamber 110. The blocking plate 170 may be arranged/disposed on the bottom surface 111 of the processing chamber 110 to cover the first inlet 141 of the first supply pipe 140 and the exhaust opening 161 of the exhaust pipe 160. The blocking plate 170 may be placed between the first inlet 141 of the first supply pipe 140 and the substrate W supported by the substrate support 120, and configured to adjust the flow direction of the processing fluid PF sprayed/provided via the first inlet 141 of the first supply pipe 140. The blocking plate 170 may block the processing fluid PF sprayed/provided via the first inlet 141 of the first supply pipe 140 from being directly sprayed on the lower surface of the substrate W. The blocking plate 170 may guide the processing fluid PF so that the processing fluid PF sprayed/provided via the first inlet 141 of the first supply pipe 140 flows in a horizontal direction or a lateral direction.

Figure 4:
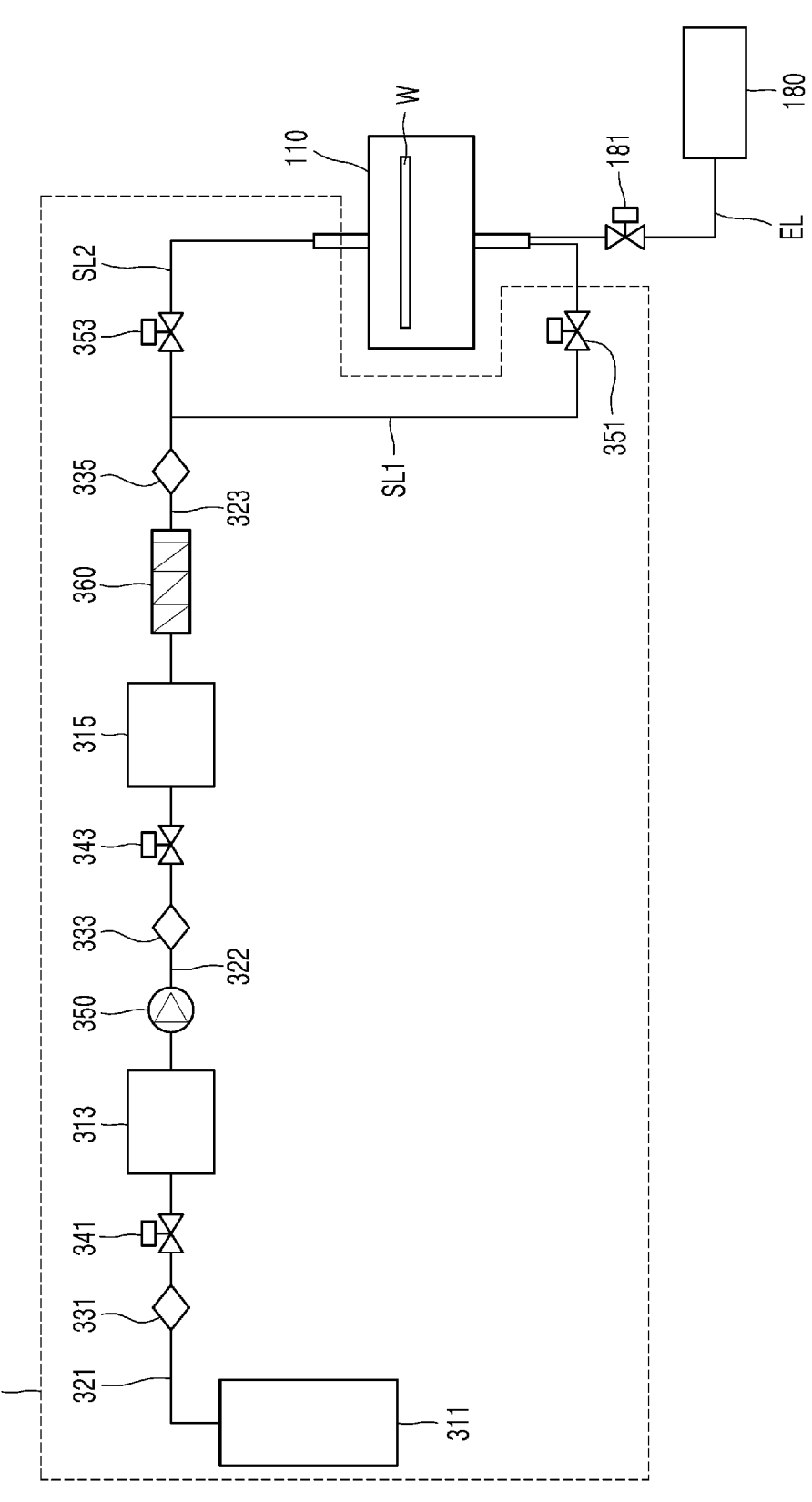
FIG. 4 is a configuration diagram of a liquid supply device of a substrate processing apparatus, according to an embodiment.

FIG. 4 is a configuration diagram of the fluid supply device 130 of the substrate processing apparatus 100, according to an embodiment.

Referring to FIGS. 1 through 4, the fluid supply device 130 may include a fluid supply tank 311, a condenser 313, a pump 350, a storage tank 315, and a heating device 360.

The fluid supply tank 311 may contain a raw material. For example, the fluid supply tank 311 may store the processing fluid PF in a gas-like state. The condenser 313 may change the phase of the processing fluid PF. The condenser 313 may cool the processing fluid PF so that the processing fluid PF changes from the gas-like state to a liquid-like state. On a first fluid supply line 321 connecting the fluid supply tank 311 to the condenser 313 such that the processing fluid PF flows from the fluid supply tank 311 to the condenser 313 through the first fluid supply line 321, a filter 331 for filtering impurities in the processing fluid PF and a valve 341 for controlling the flow of the processing fluid PF may be installed. The first fluid supply line 321 may include or may be, for example, a pipe.

The pump 350 may be installed/placed on a second fluid supply line 322 extending between the condenser 313 and the storage tank 315. The pump 350 may drive the processing fluid PF so that the processing fluid PF liquefied by the condenser 313 is supplied to the storage tank 315 along the second fluid supply line 322. On the second fluid supply line 322 connecting the condenser 313 to the storage tank 315 such that the processing fluid PF flows from the condenser 313 to the storage tank 315 through the second fluid supply line 322, a filter 333 for filtering impurities in the processing fluid PF and a valve 343 for controlling the flow of the processing fluid PF may be installed. The second fluid supply line 322 may include or may be, for example, a pipe.

The storage tank 315 may store the processing fluid PF and change the phase of the processing fluid PF to a supercritical state. The storage tank 315 may heat the processing fluid PF by using an embedded heater. The embedded heater of the storage tank 315 may heat the processing fluid PF above a critical temperature of the processing fluid PF. Accordingly, the processing fluid PF discharged from the storage tank 315 may be in the supercritical state. The processing fluid PF discharged from the storage tank 315 may flow along a third fluid supply line 323, and then may flow along the first supply line SL1 extending toward the first supply pipe 140 of the processing chamber 110 at one end of the third fluid supply line 323 and/or flow along the second supply line SL2 extending toward the second supply pipe 150 of the processing chamber 110 at the one end of the third fluid supply line 323.

On the third fluid supply line 323, the heating device 360 configured to heat the processing fluid PF discharged from the storage tank 315, and a filter 335 for filtering impurities in the processing fluid PF may be installed. The heating device 360 may control the temperature of the processing fluid PF provided to the processing chamber 110, by heating the processing fluid PF, which moves along the third fluid supply line 323. The heating device 360 may include an electric resistance type heater. The heating device 360 may include an inline heater and/or a jacket heater installed on the third fluid supply line 323. A valve 351 for controlling the flow of the processing fluid PF may be installed on the first supply line SL1, and a valve 353 for controlling the flow of the processing fluid PF may be installed on the second supply line SL2. The third fluid supply line 323 may include or may be, for example, a pipe.

In some embodiments, the fluid supply device 130 may differently control a first temperature of the processing fluid PF provided to a lower portion of the processing chamber 110 via the first supply pipe 140 from a second temperature of the processing fluid PF provided to the upper portion of the processing chamber 110 via the second supply pipe 150. For example, the first temperature of the processing fluid PF and the second temperature of the processing fluid PF may be controlled by the heater of the heating device 360 and/or the heater of the storage tank 315. In some embodiments, the first temperature of the processing fluid PF provided to the lower portion of the processing chamber 110 via the first supply pipe 140 may be lower than the second temperature of the processing fluid PF provided to the upper portion of the processing chamber 110 via the second supply pipe 150. In some embodiments, the first temperature of the processing fluid PF may be between about 35° C. and about 70° C., and the second temperature of the processing fluid PF may be between about 70° C. and about 120° C.

Figure 5:
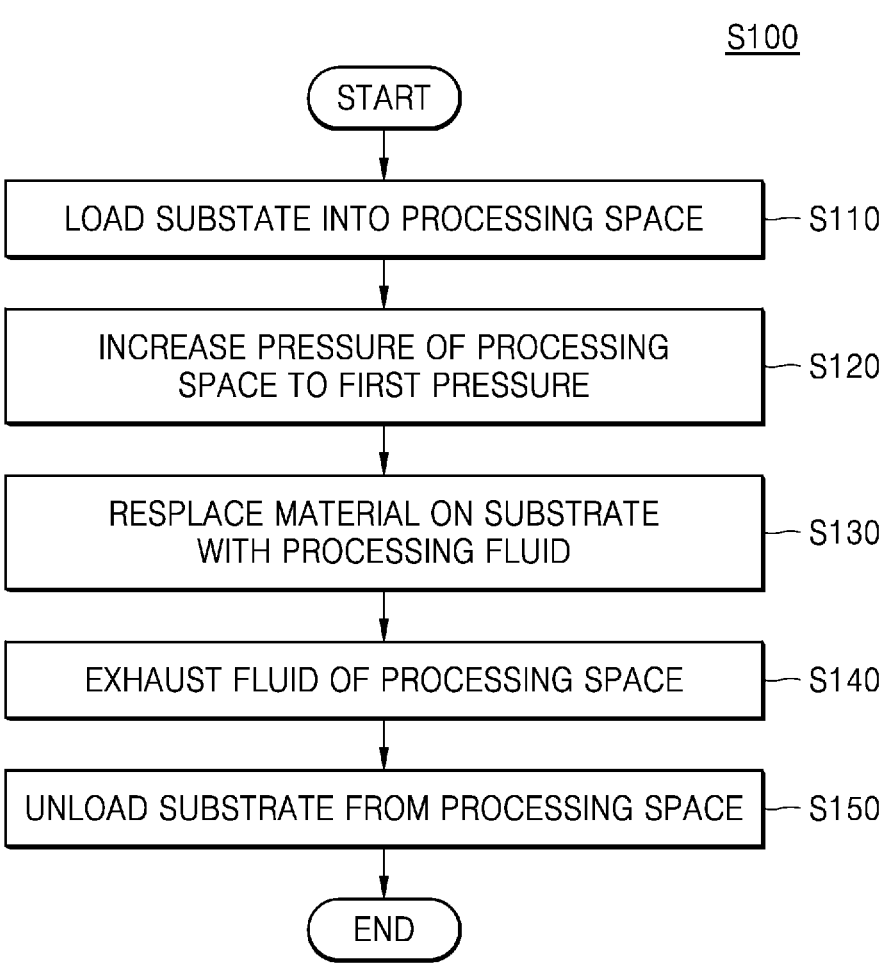
FIG. 5 is a flowchart of a substrate processing method according to an embodiment.
Figure 6:
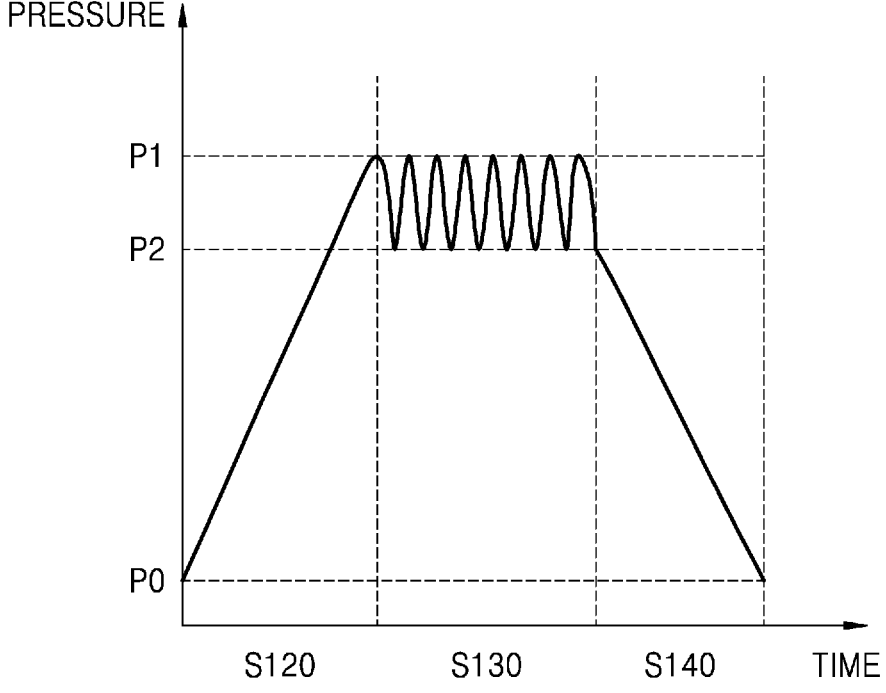
FIG. 6 is a graph illustrating a profile of pressure in a processing space while processing on a substrate is in progress.

FIG. 5 is a flowchart of a substrate processing method according to an embodiment. FIG. 6 is a graph illustrating a pressure in the processing space PS, while processing on the substrate W is in progress.

Hereinafter, an example substrate drying processing method S100 by using the substrate processing apparatus 100 described with reference to FIGS. 1 through 3 is described with reference to FIGS. 1 through 6.

Firstly, the substrate W is loaded into the processing space PS of the processing chamber 110 (S110). While the substrate W is loaded into the processing space PS, the processing chamber 110 may be positioned at an open position. The substrate W may be seated on the substrate support 120. After the substrate W is loaded on the substrate support 120, the processing chamber 110 may switch from an open position to a closed position so that the processing space PS is sealed/isolated from the outside of the processing chamber 110.

After the loading operation of the substrate W is completed, a drying process may be performed on the substrate W. The drying process of the substrate W may include operation S120 of boosting/increasing the pressure of the processing space PS to a target pressure, operation S130 of replacing the material on the substrate W with the processing fluid PF, and operation S140 of exhausting the discharge fluid DF from the processing space PS.

Operation S120 may include supplying the processing fluid PF in a supercritical state to the processing space PS so that the processing space PS is filled with the supercritical fluid. In some embodiments, by supplying the processing fluid PF in the supercritical state to the processing space PS, the fluid supply device 130 may boost/increase the pressure in the processing space PS from an initial pressure P0 which is the same as or similar to the atmospheric pressure to a first pressure P1. In some embodiments, the first pressure P1 may be higher than a critical pressure of the processing fluid PF, and may be, for example, about 150 bar.

In some embodiments, operation S120 may include a first supply operation of supplying the processing fluid PF at the first temperature to the lower portion of the processing space PS via the first supply pipe 140, and a second supply operation of supplying the processing fluid PF at the second temperature to the upper portion of the processing space PS via the second supply pipe 150. In the first supply operation, the first temperature of the processing fluid PF may be about 35° C. to about 70° C. In the second supply operation, the second temperature of the processing fluid PF may be higher than the first temperature of the processing fluid PF. In the second supply operation, the second temperature of the processing fluid PF may be between about 70° C. and about 120° C. The first supply operation may be performed until the pressure of the processing space PS reaches a target intermediate pressure between the initial pressure P0 and the first pressure P1, and for example, the target intermediate pressure may be between about 75 bar and about 90 bar. When the pressure of the processing space PS reaches the target intermediate pressure by performing the first supply operation, the second supply operation may be performed. The second supply operation may be performed until the pressure of the processing space PS reaches the first pressure P1.

In operation S130, substances (for example, developer and/or rinse liquid) on the substrate W may be mixed (or replaced) with the processing fluid PF, and the mixed fluid may be exhausted via the exhaust pipe 160.

Operation S130 may include a decompression process of reducing the pressure of the processing space PS from the first pressure P1 to a second pressure P2 lower than the first pressure P1, and a boosting process of increasing the pressure of the processing space PS from the second pressure P2 to the first pressure P1. The second pressure P2 may be between about 75 bar and about 90 bar. Operation S130 may include alternately repeating the decompression process and the boosting process, e.g., at least twice. The decompression process may include discharging the discharge fluid DF from the processing space PS via the exhaust device 180. The boosting process may include supplying the processing fluid PF at the second temperature to the upper portion of the processing space PS via the second supply pipe 150.

In operation S140, the exhaust device 180 may exhaust the discharge fluid DF from the processing space PS, and reduce the pressure in the processing space PS to the initial pressure P0.

When the drying process on the substrate W is completed, the processing chamber 110 may be switched from the closed position to the open position, and the substrate W may be unloaded from the processing space PS (S150).

Figure 7A:
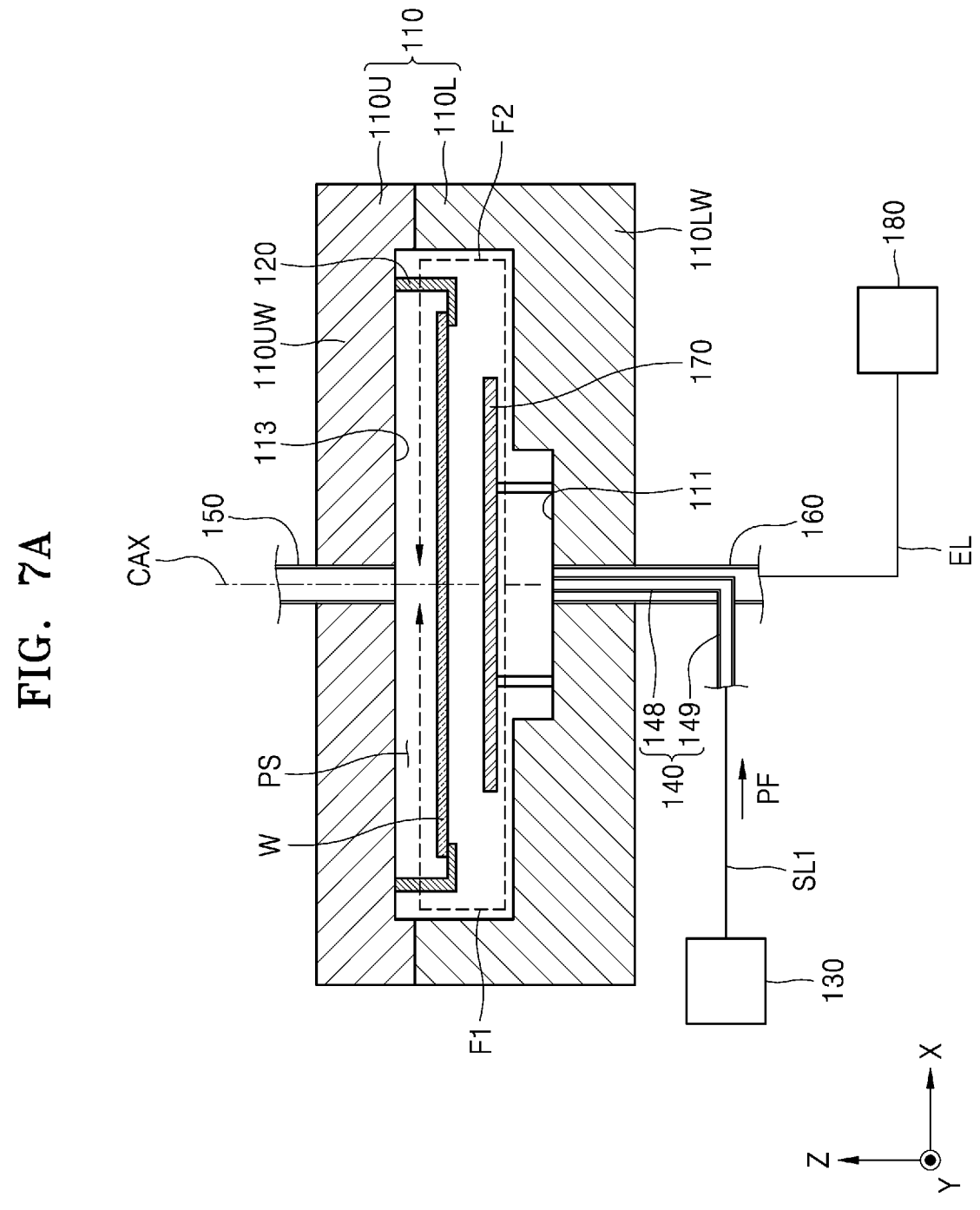
FIG. 7A is a schematic diagram of a flow of a processing fluid flowing in a processing space of a substrate processing apparatus, according to an embodiment.
Figure 7B:
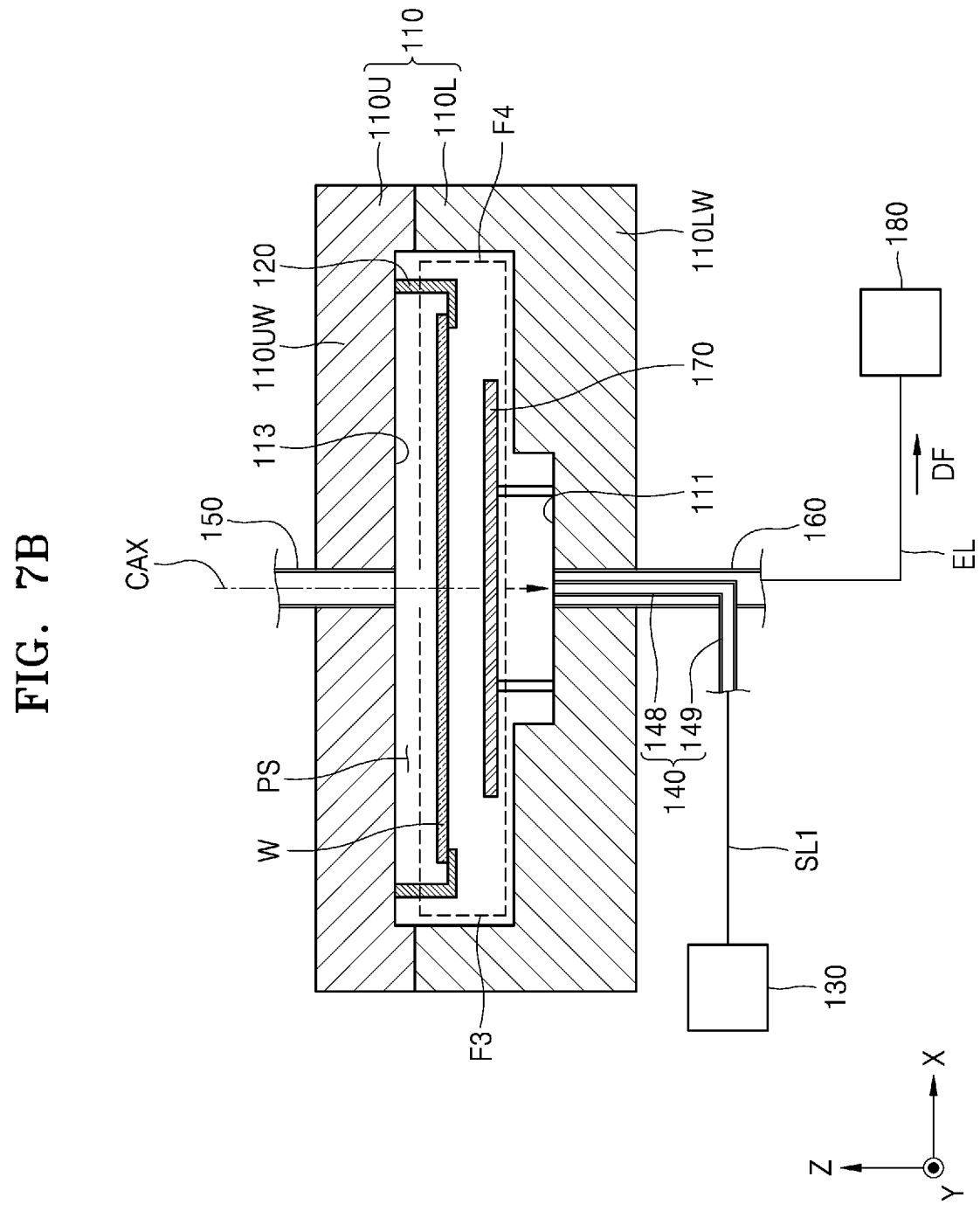
FIG. 7B is a schematic diagram of a flow of a discharge fluid exhausted in a processing space of a substrate processing apparatus, according to an embodiment.

FIG. 7A is a schematic diagram of a flow of the processing fluid PF flowing in the processing space PS in the substrate processing apparatus 100, according to an embodiment. FIG. 7B is a schematic diagram of a flow of the discharge fluid DF exhausted from the processing space PS in the substrate processing apparatus 100, according to an embodiment.

Referring to FIG. 7A, when the processing fluid PF is injected into the processing space PS via the first inlet 141 of the first supply pipe 140, the processing fluid PF may flow in an outward direction from the center of the processing chamber 110 toward the edge thereof by the blocking plate 170, move upward along the sidewalls of the processing chamber 110, and flow in an inward direction from the edge of the substrate W toward the center thereof along the upper surface thereof. Because the first supply pipe 140 is aligned with (e.g., on) the central axis CAX of the processing chamber 110, the movement path lengths of the processing fluid PF in different routes/paths (e.g., in opposite directions or in different radial directions) from the first inlet 141 to the center of the upper surface of the substrate W may become uniform (e.g., the same).

For example, a first flow F1 of the processing fluid PF may flow along a first movement path and a second flow F2 of the processing fluid PF may flow along a second movement path. The first movement path of the first flow F1 may include a path between the first inlet 141 and a left-side sidewall of the processing chamber 110, and a path between the left-side sidewall and the center of the upper surface of the substrate W. The second movement path of the second flow F2 may include a path between the first inlet 141 and a right-side sidewall of the processing chamber 110, and a path between the right-side sidewall and the center of the upper surface of the substrate W. In this case, the length of the first movement path of the first flow F1 may be substantially the same as the length of the second movement path of the second flow F2. In this case, because the characteristics (for example, speed and flow rate) of the processing fluid PF flowing on the upper surface of the substrate W is symmetrical with respect to the center of the substrate W or uniform in a radial direction of the substrate W, the uniformity of the drying process on the substrate W may be improved.

Referring to FIG. 7B, when the exhaust device 180 discharges the discharge fluid DF from the processing space PS to the outside, the discharge fluid DF of the processing space PS may be sucked via the exhaust pipe 160 aligned with (e.g., disposed on) the central axis CAX of the processing chamber 110. Because the exhaust pipe 160 is aligned with the central axis CAX of the processing chamber 110, the length of the movement path of the discharge fluid DF from the center of the upper surface of the substrate W to the exhaust pipe 160 may become uniform, e.g., throughout different paths of different radial directions.

For example, a third flow F3 of the discharge fluid DF may flow along a third movement path and a fourth flow F4 of the processing fluid PF may flow along a fourth movement path. The third movement path of the third flow F3 may include a path between the center of the upper surface of the substrate W and the left-side sidewall of the processing chamber 110, and a path between the left-side sidewall and the exhaust pipe 160. The fourth movement path of the fourth flow F4 may include a path between the center of the upper surface of the substrate W and the right-side sidewall of the processing chamber 110, and a path between the right-side sidewall and the exhaust pipe 160. The length of the third movement path of the third flow F3 of the discharge fluid DF may be substantially the same as the length of the fourth movement path of the fourth flow F4 of the discharge fluid DF. In this case, because the characteristics (for example, speed and flow rate) of the discharge fluid DF exhausted from the processing space PS are symmetrical with respect to the center of the substrate W or uniform throughout different paths in different radial directions of the substrate W, the uniformity of the drying process on the substrate W may be improved.

Figure 8:
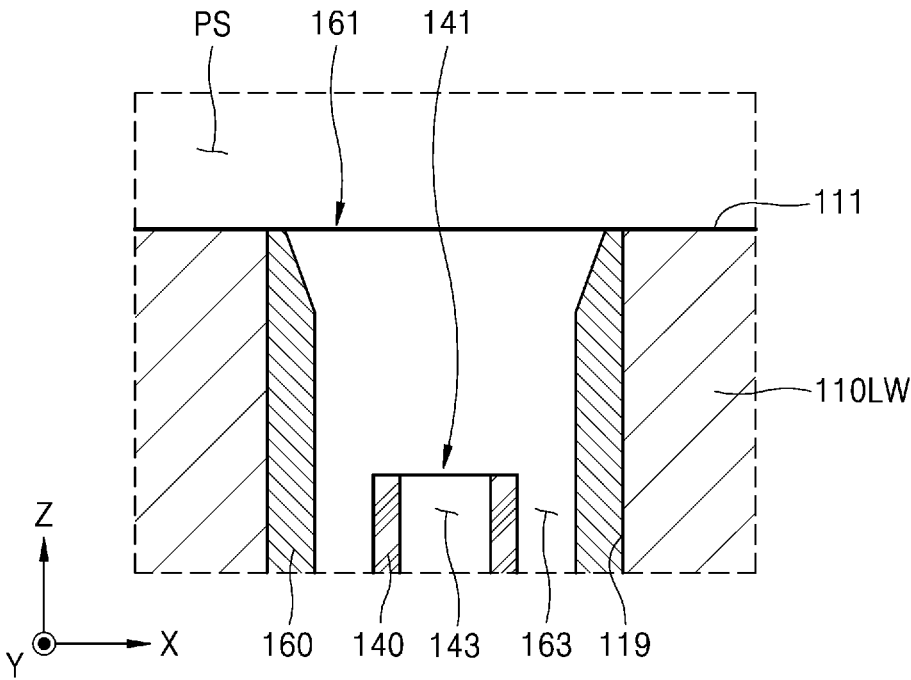
FIG. 8 is a cross-sectional view of a portion of a substrate processing apparatus, according to an embodiment.

FIG. 8 is a cross-sectional view of a portion of a substrate processing apparatus, according to an embodiment. Hereinafter, the substrate processing apparatus of FIG. 8 is described mainly on differences from the substrate processing apparatus 100 described with reference to FIGS. 1 through 3.

Referring to FIG. 8, an end portion of the first supply pipe 140 may be inside the exhaust pipe 160. The exhaust pipe 160 may protrude from the end portion of the first supply pipe 140 toward the processing space PS. The first inlet 141 provided at the end portion of the first supply pipe 140 may be located at a vertical level lower than a vertical level of the exhaust opening 161 of the exhaust pipe 160. For example, when an end portion of the exhaust pipe 160 is at approximately/substantially the same vertical level as the bottom surface 111 of the processing chamber 110, the end portion of the first supply pipe 140 may be located at a height lower than the end portion of the exhaust pipe 160 and/or the bottom surface 111 of the processing chamber 110. In some embodiments, a distance (e.g., in a vertical direction) between the end portion of the first supply pipe 140 and the end portion of the exhaust pipe 160 may be about 50 mm or more. The processing fluid PF may be introduced into the processing space PS via a path between the first inlet 141 of the first supply pipe 140 and the exhaust opening 161 of the exhaust pipe 160. Because the processing fluid PF is stabilized in the process of flowing along the path between the first inlet 141 of the first supply pipe 140 and the exhaust opening 161 of the exhaust pipe 160, the flow of the processing fluid PF in the processing space PS may be further stabilized.

Figure 9:
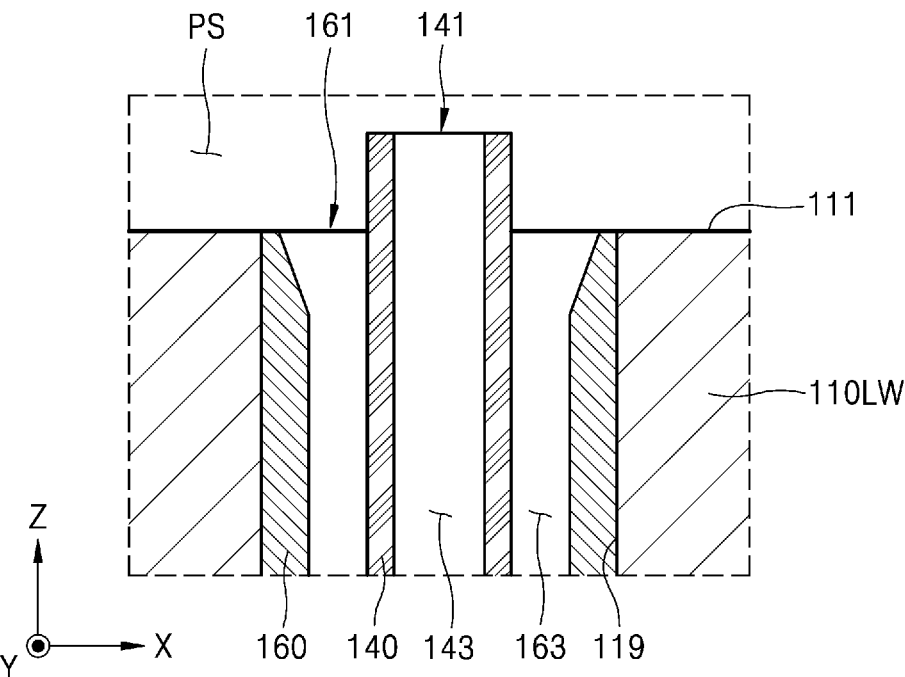
FIG. 9 is a cross-sectional view of a portion of a substrate processing apparatus, according to an embodiment.

FIG. 9 is a cross-sectional view of a portion of a substrate processing apparatus, according to an embodiment. Hereinafter, the substrate processing apparatus of FIG. 9 is described mainly on differences from the substrate processing apparatus 100 described with reference to FIGS. 1 through 3.

Referring to FIG. 9, the first supply pipe 140 may protrude from the exhaust pipe 160 toward the processing space PS. The first inlet 141 provided at the end portion of the first supply pipe 140 may be located at a vertical level higher than a vertical level of the exhaust opening 161 of the exhaust pipe 160. For example, when an end portion of the exhaust pipe 160 is at approximately/substantially the same level as the bottom surface 111 of the processing chamber 110, the end portion of the first supply pipe 140 may be located at a height higher than the end portion of the exhaust pipe 160 and/or the bottom surface 111 of the processing chamber 110. In some embodiments, a distance (e.g., in a vertical direction) between the end portion of the first supply pipe 140 and the end portion of the exhaust pipe 160 may be about 50 mm or more. When the first supply pipe 140 protrudes from the exhaust pipe 160 toward the processing space PS, the flowing of the discharge fluid DF exhausted via the exhaust pipe 160 into the first supply pipe 140 may be reduced.

Figure 10:
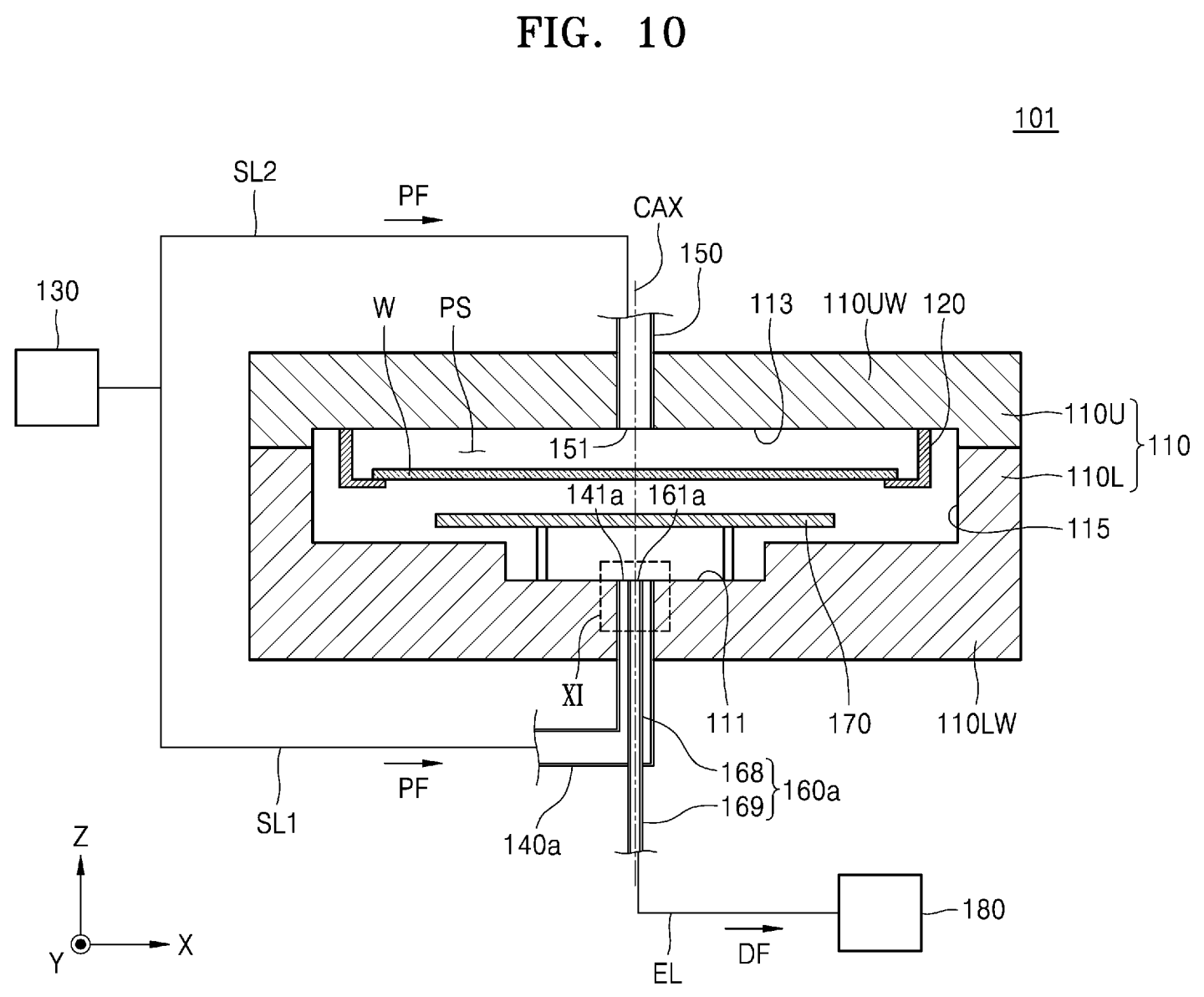
Figure 11:
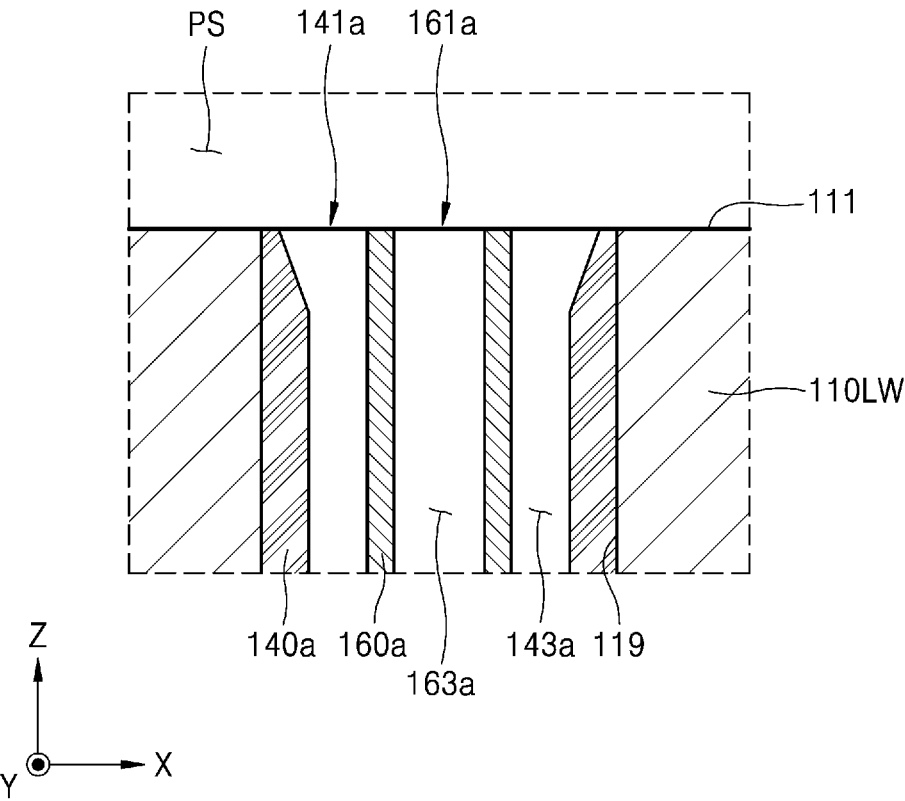
FIG. 11 is an enlarged cross-sectional view of region XI in FIG. 10.

FIG. 10 is a cross-sectional view of a substrate processing apparatus 101 according to an embodiment. FIG. 11 is an enlarged cross-sectional view of region XI in FIG. 10. Hereinafter, the substrate processing apparatus 101 of FIGS. 10 and 11 is described mainly on differences from the substrate processing apparatus 100 described with reference to FIGS. 1 through 3.

Referring to FIGS. 10 and 11, a portion of an exhaust pipe 160a may extend in a first supply pipe 140a. For example, the exhaust pipe 160a may be inserted into the first supply pipe 140a via a through hole of the first supply pipe 140a. The exhaust pipe 160a may include a first portion 168 inserted into the first supply pipe 140a and a second portion 169 outside the first supply pipe 140a. The first portion 168 of the exhaust pipe 160a may be adjacent to the processing space PS (e.g., the first portion 168 of the exhaust pipe 160a may be closer than the second portion 169 of the exhaust pipe 160 to the processing space PS), and may include an exhaust opening 161a. The first portion 168 of the exhaust pipe 160a may extend downward along the first supply pipe 140a from the bottom surface 111 of the processing chamber 110. Because the first portion 168 of the exhaust pipe 160a is inserted into the first supply pipe 140a, an outer diameter of the first portion 168 of the exhaust pipe 160a may be less than an inner diameter of the first supply pipe 140a. For example, the outer diameter of the first portion 168 of the exhaust pipe 160a may be a diameter of a circumference formed by an overlapping line (curve/circle) between a horizontal plane and an outer surface of the first portion 168 of the exhaust pipe 160a, and the inner diameter of the first supply pipe 140a may be a diameter of a circumference formed by an overlapping line (curve/circle) between a horizontal plane and an inner surface of the first supply pipe 140a. In a section/portion where the first portion 168 of the exhaust pipe 160a is inserted in the first supply pipe 140a, a first supply flow path 143a of the first supply pipe 140a may be a space between an inner surface of the first supply pipe 140a and an outer surface of the first portion 168 of the exhaust pipe 160a. The diameter or width (e.g., a distance between opposite ends of a horizontal circumference) of the exhaust flow path 163a of the exhaust pipe 160a in a horizontal direction may be less than the diameter or width (e.g., a distance between opposite ends in a horizontal circumference) of the first supply flow path 143a of the first supply pipe 140a.

The second portion 169 of the exhaust pipe 160a may be connected to the exhaust line EL. As the first portion 168 of the exhaust pipe 160a is inserted into the first supply pipe 140a, a double pipe structure may be formed. In some embodiments, the end portion of the exhaust pipe 160a may be at substantially the same vertical level as the end portion of the first supply pipe 140a. For example, the end portion of the exhaust pipe 160a and the end portion of the first supply pipe 140a may be at the same vertical level as the bottom surface 111 of the processing chamber 110. In other embodiments, the exhaust pipe 160a may protrude from the end portion of the first supply pipe 140a toward the processing space PS. In other embodiments, the first supply pipe 140a may protrude from the end portion of the exhaust pipe 160a toward the processing space PS.

Figure 12:
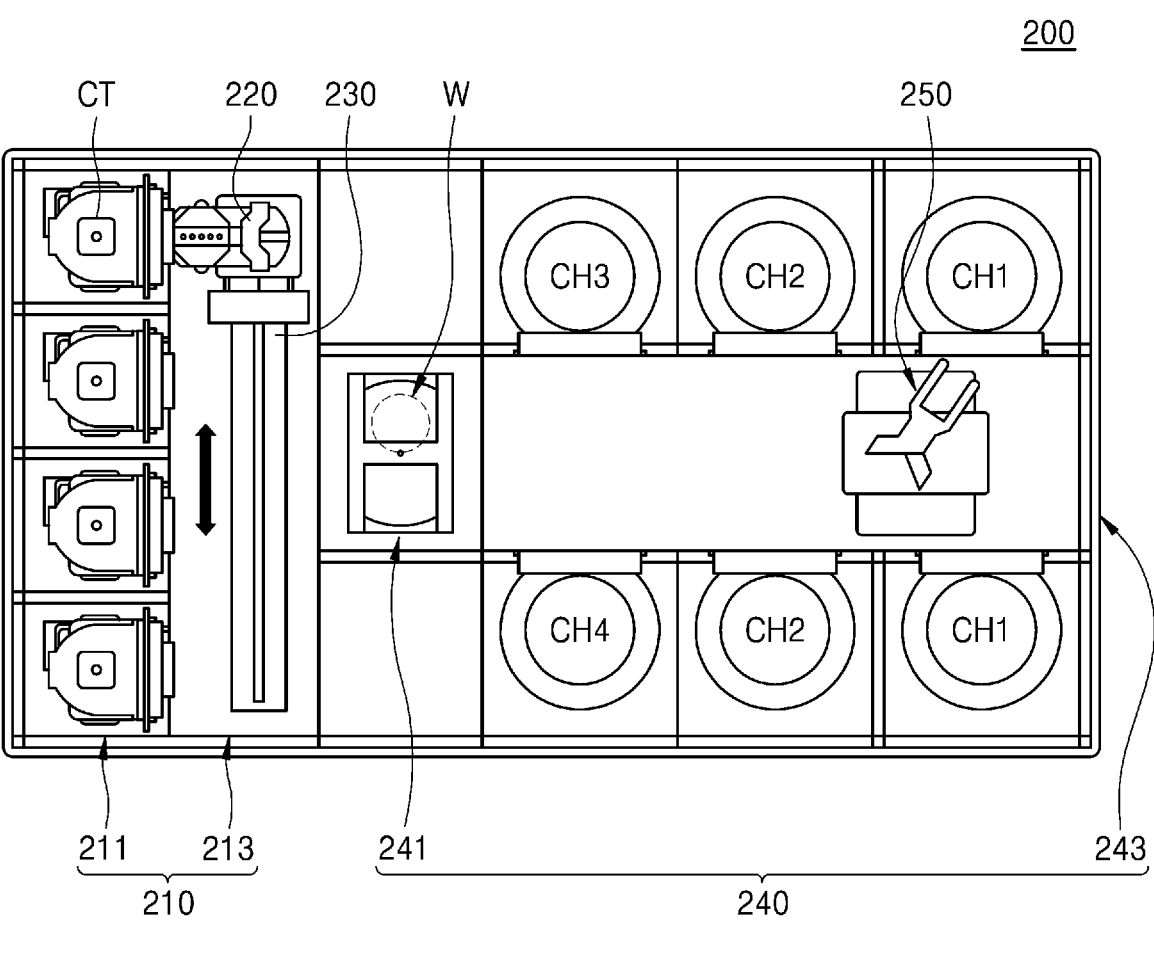
FIG. 12 is a cross-sectional view of a substrate processing apparatus according to an embodiment.
Figure 12:
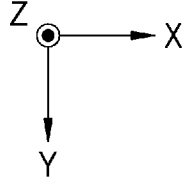

FIG. 12 is a cross-sectional view of a substrate processing apparatus 200 according to an embodiment.

Referring to FIG. 12, the substrate processing apparatus 200 may include an index module 210, a processing module 240, and a substrate transfer unit 250.

The index module 210 may include a load port 211 and a transfer frame 213. The load port 211, the transfer frame 213, and the processing module 240 may be sequentially arranged in a row, e.g., in a horizontal direction. A direction, in which the load port 211, the transfer frame 213, and the processing module 240 are arranged in a row, may be an X direction, a horizontal direction perpendicular to the X direction may be a Y direction, and a direction perpendicular to both of the X direction and the Y direction may be a Z direction.

A substrate container CT, in which the substrate W is accommodated, may be seated in the load port 211. A plurality of load ports 211 may be provided in the substrate processing apparatus 200, and may be arranged in a line in the Y direction. Even though four load ports 211 are illustrated in FIG. 12, the number of the load ports 211 included in the substrate processing apparatus 200 may vary (e.g., be increased or decreased) according to embodiments and/or conditions, such as process efficiency and/or installation area. The substrate container CT may include a plurality of slots configured to support edges of the substrate W. The plurality of slots may be spaced apart from each other in the Z direction, and accordingly, a plurality of substrates W may be mounted on the substrate container CT in the Z direction. The substrate container CT may be, for example, a front opening unified pod (FOUP).

The transfer frame 213 may transfer the substrate W between the substrate container CT on the load port 211 and a buffer chamber 241 of the processing module 240. The transfer frame 213 may include an index robot 220 and an index rail 230. The index rail 230 may extend in the Y direction. The index robot 220 may be installed on the index rail 230, and may move linearly in the Y direction along the index rail 230.

The processing module 240 may contain the buffer chamber 241, a transfer chamber 243, and first through fourth processing chambers CH1, CH2, CH3, and CH4. The transfer chamber 243 may extend in the X direction. In some embodiments, at least some of the first through fourth processing chambers CH1, CH2, CH3, and CH4 may be apart from each other in the Y direction with the transfer chamber 243 therebetween. For example, at least some of the first through fourth processing chambers CH1, CH2, CH3, and CH4 may be arranged in/along the X direction, e.g., in a line. In other embodiments, some of the first through fourth processing chambers CH1, CH2, CH3, and CH4 may be stacked in the Z direction.

In FIG. 12, the arrangement of the first through fourth processing chambers CH1, CH2, CH3, and CH4 is an example, and the first through fourth processing chambers CH1, CH2, CH3, and CH4 may be variously arranged as necessary. For example, all of the first through fourth processing chambers CH1, CH2, CH3, and CH4 may be arranged only on one side of the transfer chamber 243.

The buffer chamber 241 may be arranged between the transfer frame 213 and the transfer chamber 243. The buffer chamber 241 may provide an internal space, in which the substrate W is stored, between the transfer chamber 243 and the transfer frame 213. The buffer chamber 241 may include the plurality of slots and/or the internal space, in which the substrate W is stored. The plurality of slots may overlap each other, e.g., in a vertical direction (e.g., Z-direction), and be apart from each other in the Z direction. The buffer chamber 241 may include an opening, through which the substrate W can enter and exit, on each side/surface facing the transfer frame 213 and/or facing the transfer chamber 243.

The substrate transfer unit 250 may transfer the substrate W between the buffer chamber 241 and the first through fourth processing chambers CH1, CH2, CH3, and CH4. The substrate transfer unit 250 may be in the transfer chamber 243. The substrate transfer unit 250 may be installed on a rail extending in the X direction, and may move linearly in the X direction along the rail. Between the first through fourth processing chambers CH1, CH2, CH3, and CH4, the substrate W may be transferred by the substrate transfer unit 250.

The first through fourth processing chambers CH1, CH2, CH3, and CH4 may sequentially perform processes on one substrate W. For example, after a developing process is performed on the substrate W in a first processing chamber CH1, a drying process may be performed on the substrate W in a second processing chamber CH2. In this case, the developing process may include a process of removing a portion of photoresist layer formed on the substrate W that has been exposed (or has not been exposed) by extreme ultra-violet (EUV) light during an exposure process. The drying process may be performed by a processing fluid PF in the supercritical state. In some embodiments, the processing fluid PF in the supercritical state may include carbon dioxide ($CO_2$).

The first processing chamber CH1 may supply a developer to the substrate W in a dry state (e.g., on a dry substrate W) by using a spray device. The developer may include, for example, a non-polar organic solvent. The developer may include a liquid capable of selectively removing a soluble region of the photoresist reactive to the EUV light. For example, due to the developer in the first processing chamber CH1, the substrate W in the dry state may change into a wet state. A plurality of first processing chambers CH1 may be arranged in the processing module 240, and the number of first processing chambers CH1 may vary (e.g., be increased or decreased) according to process efficiency and/or an installation area of the processing module 240. For example, the plurality of first processing chambers CH1 may perform the same process which is described above.

The second processing chamber CH2 may receive the substrate W in the wet state transferred from the first processing chamber CH1, and may remove a developer from the transferred substrate W by using the supercritical fluid. In general, a method of rotating the substrate W at high speed is used, but a photoresist pattern may collapse due to surface tension, e.g., caused by a centrifugal force, during a high speed rotation, and to solve this issue, the developer may be removed by dissolving the developer in the supercritical fluid and discharging the supercritical fluid. In this manner, by removing the developer and the supercritical fluid together from the substrate W, the substrate W in the wet state may dry. For example, due to the drying process in the second processing chamber CH2, the substrate W in the wet state may change into the dry state. A plurality of second processing chambers CH2 may be arranged in the processing module 240, and the number of second processing chambers CH2 may vary (e.g., be increased or decreased) according to process efficiency and/or an installation area of the processing module 240. In some embodiments, the second processing chamber CH2 may correspond to any one of the substrate processing apparatuses 100 and 101 described with reference to FIGS. 1 through 11.

The third processing chamber CH3 may receive the substrate W from the second processing chamber CH2, and may perform a bake process to completely dry the substrate W. On a hot plate in the third processing chamber CH3, the bake process at a temperature of about 120° C. to about 170° C. for about 30 seconds to about 120 seconds may be performed on the substrate W. For example, due to the baking process in the third processing chamber CH3, the substrate W may be maintained in a dry state.

The fourth processing chamber CH4 may receive the substrate W from the third processing chamber CH3, and may perform a cooling process to lower the temperature of the substrate W. A cooling process may be performed on a cooling plate in the fourth processing chamber CH4. For example, due to the cooling process in the fourth processing chamber CH4, the substrate W may be maintained in a cool and dry state.

Figure 13:
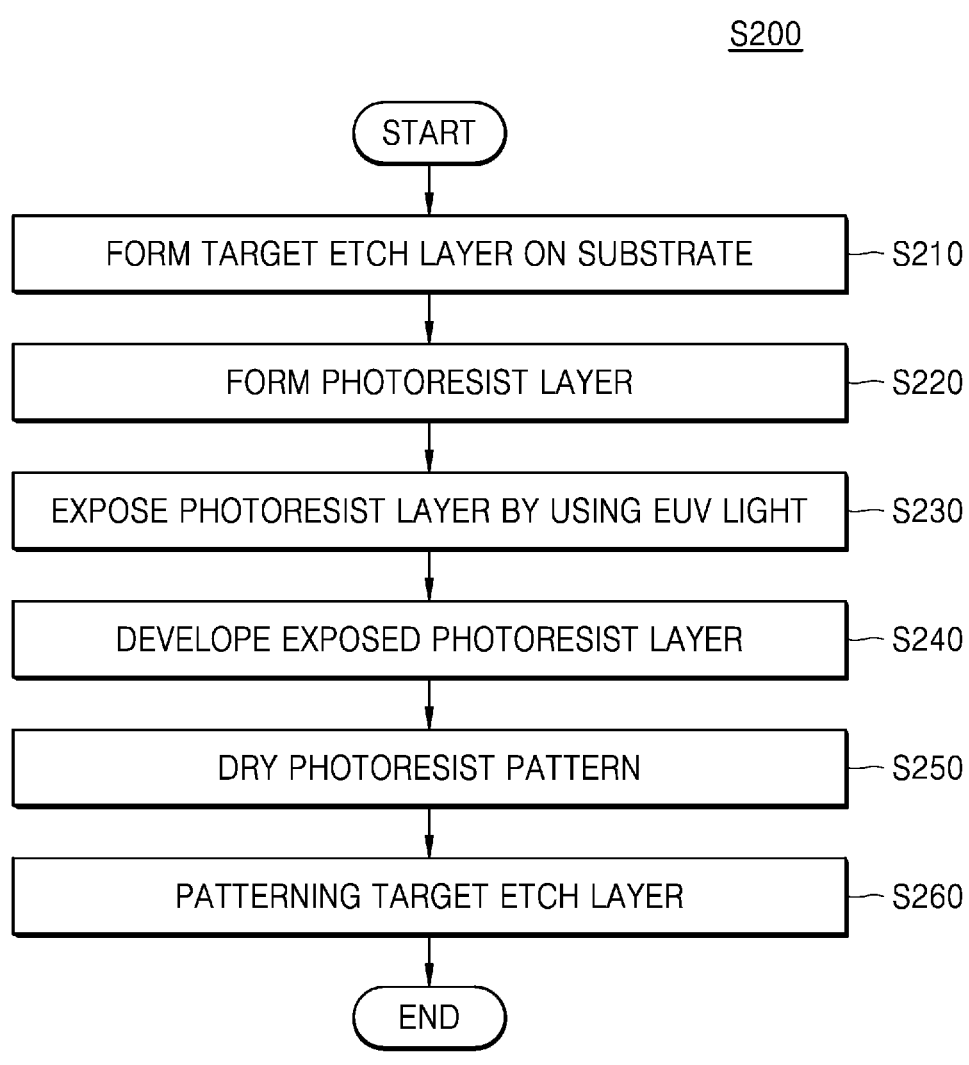
FIG. 13 is a flowchart of a fine pattern forming method by using a substrate processing apparatus, according to an embodiment.

FIG. 13 is a flowchart of a fine pattern forming method S200 by using a substrate processing apparatus, according to an embodiment.

Referring to FIG. 13, the fine pattern forming method S200 may include a process sequence of first through sixth operations S210 through S260.

When a certain embodiment is implemented differently, a particular process sequence may also be executed differently from the sequence to be described. For example, two consecutively described processes may also be performed substantially at the same time or in a sequence opposite to the sequence to be described.

The fine pattern forming method S200 according to the embodiment may include a first operation S210 of forming an target etch layer on a substrate, a second operation S220 of forming a photoresist layer, a third operation S230 of exposing the photoresist layer by using EUV light, a fourth operation S240 for developing the exposed photoresist layer, a fifth operation S250 for drying a photoresist pattern, and a sixth operation S260 for patterning the target etch layer.

Technical characteristics of each of first through sixth operations S210 through S260 are described in detail with reference to FIGS. 14A through 14H.

FIGS. 14A through 14H are cross-sectional views of the fine pattern forming method of FIG. 13 according to the process sequence.

Figure 14A:
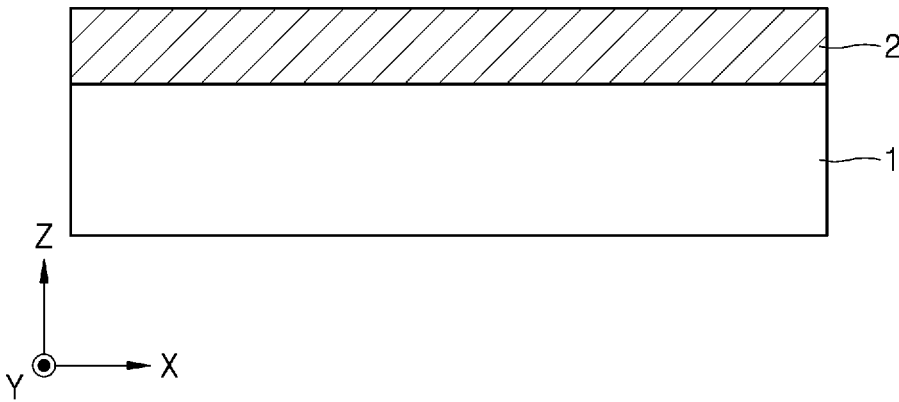
FIGS. 14A through 14H are cross-sectional views of the fine pattern forming method of FIG. 13 according to a process sequence.

Referring to FIG. 14A, the target etch layer 2 may be formed on a substrate 1.

Hereinafter, the substrate 1 may correspond to the substrate W described above with reference to FIGS. 1 through 12. The substrate 1 may include or may be, for example, a silicon (Si) wafer including crystalline Si, polycrystalline Si, or amorphous Si. Alternatively, the substrate 1 may include or be formed of semiconductor elements such as germanium (Ge), or a compound semiconductor such as silicon carbide (SiC), gallium arsenide (GaAs), indium arsenide (InAs), and indium phosphide (InP).

In certain embodiments, the substrate 1 may have a silicon on insulator (SOI) structure. For example, the substrate 1 may include a buried oxide (BOX) layer. In some embodiments, the substrate 1 may include, as a conductive region, a structure, on which wells or impurities are doped. The substrate 1 may have various device isolation structures, such as a shallow trench isolation (STI) structure.

Semiconductor devices, such as transistors and diodes, may be formed on the substrate 1. A plurality of wirings may be arranged in multiple layers on the substrate 1, and may be electrically separated by interlayer insulating layers.

The target etch layer 2 may include or may be a conductive layer, a dielectric layer, an insulating layer, or a combination thereof. For example, the target etch layer 2 may include or be formed of a metal, an alloy, metal carbide, metal nitride, metal oxynitride, metal oxycarbide, a semiconductor material, polysilicon, silicon oxide, silicon nitride, silicon oxynitride, or a combination thereof, but is not limited thereto.

Figure 14B:
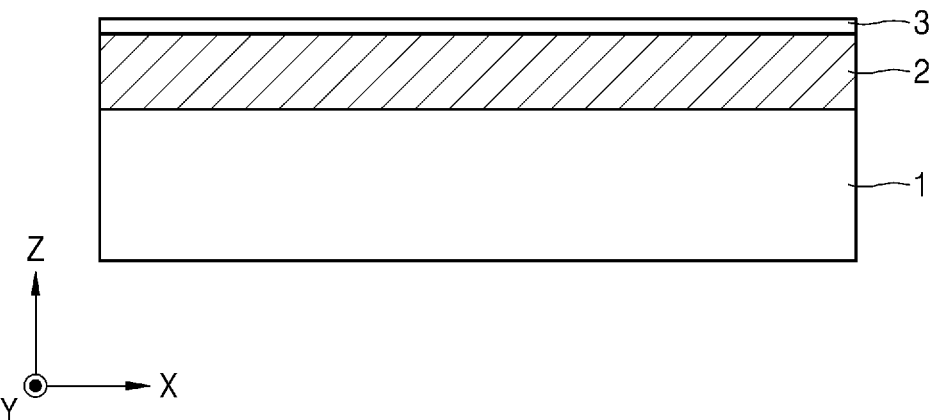

Referring to FIG. 14B, an anti-reflection layer 3 may be formed on the target etch layer 2.

The anti-reflection layer 3 may prevent the total reflection and/or reduce reflection of EUV light in a subsequent exposure process. The anti-reflection layer 3 may include or be formed of an organic component having a light absorbing structure, and a solvent for dispersing the organic component. The light absorbing structure may include or be formed of, for example, a hydrocarbon compound having a structure of one or more benzene rings or having a structure, in which benzene rings are fused.

The anti-reflection layer 3 may be formed by, for example, a spin coating process, but is not limited thereto.

Figure 14C:
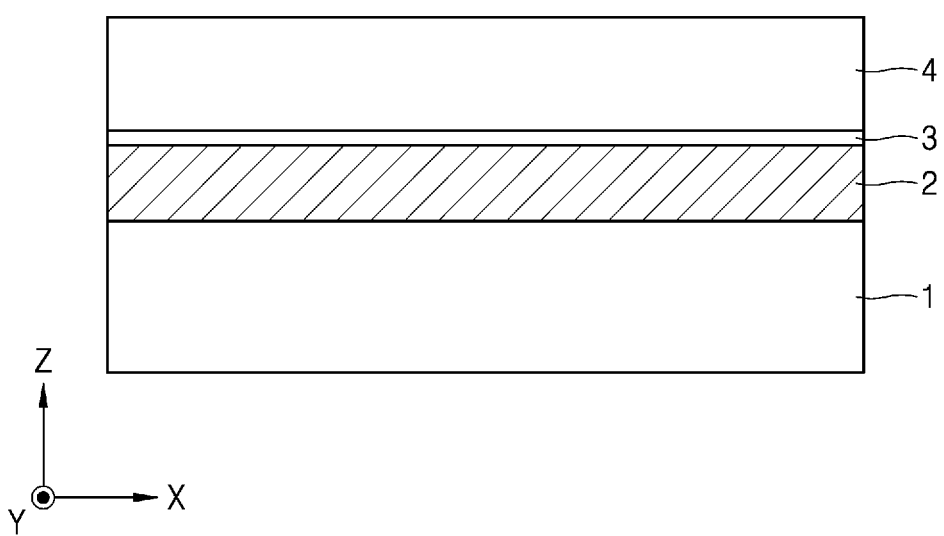

Referring to FIG. 14C, a photoresist layer 4 may be formed on the anti-reflection layer 3.

The photoresist layer 4 may be formed by a process of spin coating, spray coating, dip coating, etc. The photoresist layer 4 may be formed to have a thickness of, for example, about 30 nm to about 150 nm. After the photoresist layer 4 is formed, a soft bake process may be performed at a temperature of about 80° C. to about 220° C. for about 40 seconds to about 210 seconds.

Figure 14D:
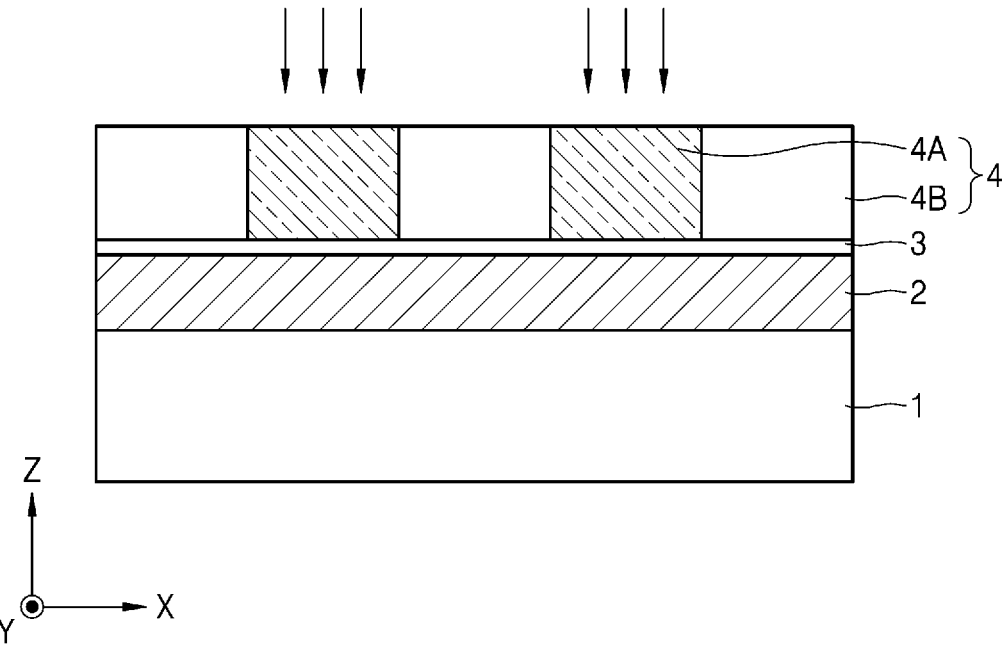

Referring to FIGS. 14C and 14D, the photoresist layer 4 may be exposed by using an EUV exposure apparatus.

Depending on the type of photoresist, the exposed portion may be removed by a development process, or the unexposed portion may be removed by a development process. An embodiment, the case, in which the unexposed portion is later removed by using a negative tone developer (NTD), is described below. One of ordinary skill in the art will understand that the same method or a similar method is applicable to the case, in which the exposed portion is later removed by a positive tone developer (PTD).

The exposed photoresist layer 4' exposed to EUV may be divided into an exposed portion 4A and an unexposed portion 4B. The exposed portion 4A of the exposed photoresist layer 4' may generate acid from a photo acid generator contained in the exposed photoresist layer 4', and thus may cause de-protection of photosensitive polymer. Unlike this case, because the EUV light has not been irradiated to the unexposed portion 4B, such a chemical reaction may not occur.

Figure 14E:
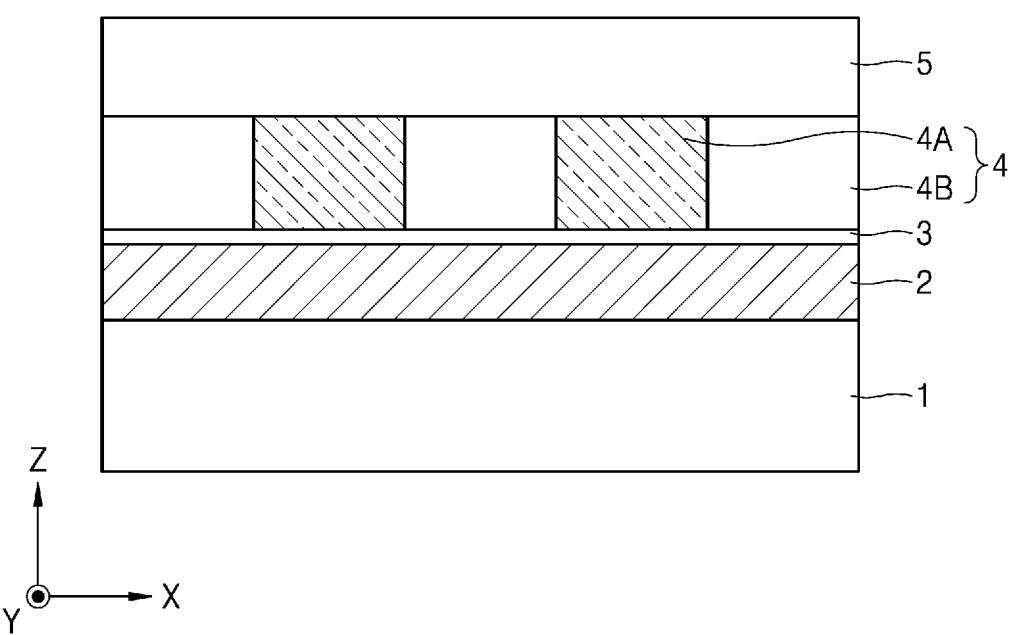

Referring to FIG. 14E, the exposed photoresist layer 4' may be developed.

The exposed photoresist layer 4' may be developed by using a developer, such as a non-polar organic solvent. To develop the exposed photoresist layer 4', a developer layer 5 may be formed on the exposed photoresist layer 4'. Because the developer of the developer layer 5 is not exposed to the EUV light and has good miscibility with polymers maintaining a protective group, the unexposed portion of the photoresist layer 4' may be dissolved by the developer layer 5. In addition, because the portion exposed to the EUV light is de-protected, miscibility with the developer may be relatively poor.

Figure 14F:
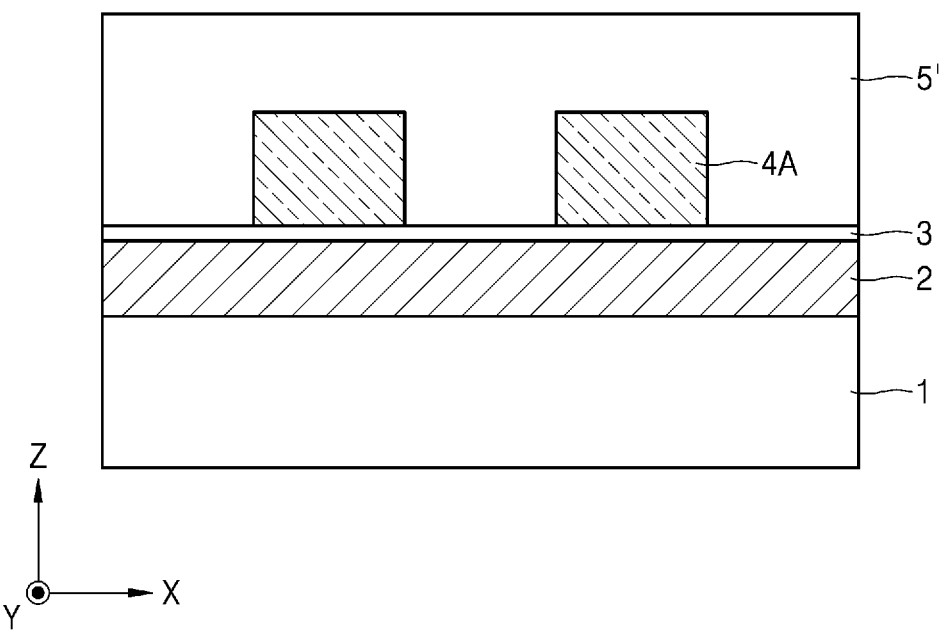

Referring to FIG. 14F, a mixed developer layer 5', in which the unexposed portion 4B is dissolved into and mixed with the developer (material) of the developer layer 5, may be obtained.

Because the exposed portion 4A is not dissolved in the developer of the mixed developer layer 5', the exposed portion 4A may remain in its original state (e.g., the exposed state). The exposed portion 4A may be surrounded by the mixed developer layer 5'.

Figure 14G:
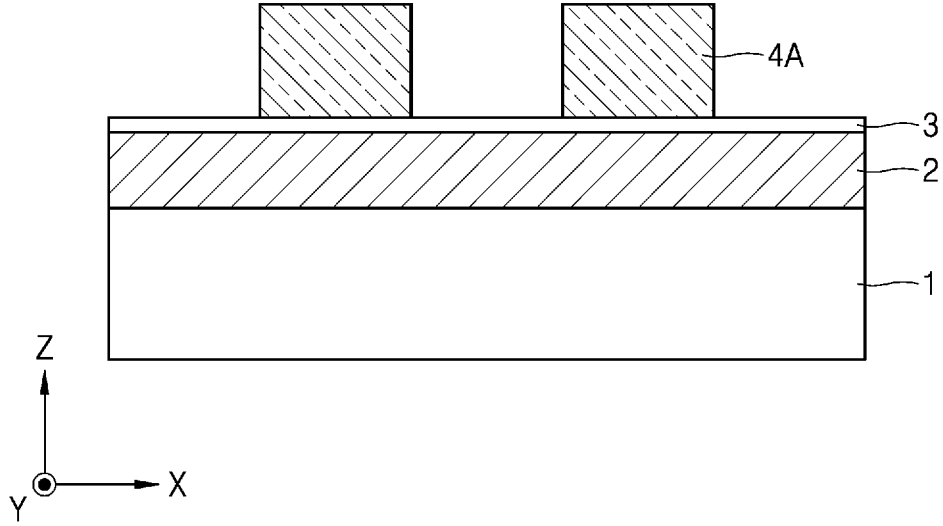

Referring to FIGS. 14F and 14G, the mixed developer layer 5' may be removed, and the exposed portion 4A may remain and be exposed. In some embodiments, to remove the mixed developer layer 5', the substrate drying processing method S100 described above with reference to FIG. 5 may be performed.

In some embodiments, a bake process which may be the same as or similar to a bake process described above may be performed on the exposed portion 4A. The bake process on the exposed portion 4A may be performed at a temperature of about 213° C. to about 170° C. for about 30 seconds to about 213 seconds, but is not limited thereto.

Figure 14H:
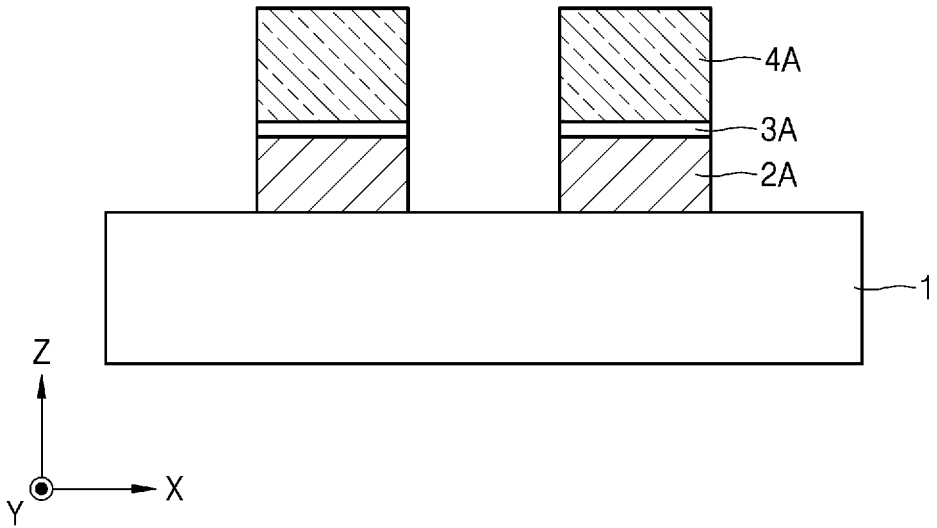

Referring to FIGS. 14G and 14H, by using the exposed portion 4A as an etching mask, and by patterning the target etch layer 2 by using an anisotropic etching process, a fine pattern 2A may be formed.

The target etch layer 2 may be patterned by using a process, such as plasma etching, reactive ion etching (ME), and/or ion beam etching. The anti-reflection layer 3 may also be removed by the etching process leaving a residual portion 3A.

By removing the exposed portion 4A and the residual portion 3A remaining on the fine pattern 2A, the desired fine pattern 2A may be finally obtained. The fine pattern 2A may have a width of about 5 nm to about 20 nm. In some embodiments, the fine pattern 2A may have a width of about 3 nm to about 20 nm, but is not limited thereto.

The fine pattern 2A may constitute various elements necessary for implementing an integrated circuit device. For example, the fine pattern 2A may include or may be an active region defined on the substrate 1 of a semiconductor device. Alternatively, the fine pattern 2A may include or may be a plurality of contact hole patterns or a plurality of line and space patterns.

The fine pattern 2A may include or may be a conductive pattern or an insulating pattern. For example, the conductive pattern may constitute a bit line forming pattern arranged in a cell array region of an integrated circuit device, a direct contact forming pattern, a buried contact forming pattern, a capacitor lower electrode forming pattern, or a conductive pattern arranged in a core region of the integrated circuit device.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

While the inventive concept has been particularly shown and described with reference to embodiments thereof, it will be understood that various changes in form and details may be made therein without departing from the spirit and scope of the following claims.

What is claimed is:

1. A substrate processing apparatus comprising:
   a processing chamber including a processing space;
   a substrate support configured to support a substrate in the processing chamber;
   an exhaust pipe arranged on a bottom wall of the processing chamber, the exhaust pipe having an exhaust opening;
   an exhaust device configured to exhaust a fluid in the processing space via the exhaust opening of the exhaust pipe;
   a first supply pipe including a first portion arranged on the bottom wall of the processing chamber within the exhaust pipe and a second portion outside the exhaust pipe, the first supply pipe having a first inlet opening into the processing chamber and spaced apart from the exhaust opening; and
   a fluid supply device configured to supply a processing fluid in a supercritical state to the processing space via the first inlet of the first supply pipe,
   wherein the second portion of the first supply pipe is outside of the processing chamber.

2. The substrate processing apparatus of claim 1, wherein
   the first inlet is at an end portion of the first supply pipe and the exhaust opening is at an end portion of the exhaust pipe,
   the first inlet and the exhaust opening are on a central axis of the processing chamber, and
   the first inlet of the first supply pipe vertically overlaps the exhaust opening of the exhaust pipe.

3. The substrate processing apparatus of claim 2, wherein, in a plan view, a center of the first inlet is inside the exhaust opening.

4. The substrate processing apparatus of claim 2, wherein, in a plan view, a center of the exhaust opening is inside the first inlet.

5. The substrate processing apparatus of claim 1, further comprising a second supply pipe arranged on an upper wall of the processing chamber, and configured to supply the processing fluid provided by the fluid supply device, to the processing space.

6. The substrate processing apparatus of claim 5, wherein a second inlet at an end portion of the second supply pipe at the upper wall of the processing chamber vertically overlaps the first inlet of the first supply pipe.

7. The substrate processing apparatus of claim 6, wherein a center of the first inlet of the first supply pipe, a center of the exhaust opening at an end portion of the exhaust pipe, and a center of the second inlet are aligned along the central axis of the processing chamber.

8. The substrate processing apparatus of claim 5, wherein the fluid supply device is configured to supply the processing fluid at a first temperature to a lower portion of the processing space via the first supply pipe, and to supply the processing fluid at a second temperature higher than the first temperature to an upper portion of the processing space via the second supply pipe.

9. The substrate processing apparatus of claim 1, wherein the exhaust pipe extends beyond an end portion of the first supply pipe toward the processing space.

10. The substrate processing apparatus of claim 1, wherein the first supply pipe extends beyond an end portion of the exhaust pipe toward the processing space.

11. The substrate processing apparatus of claim 2, further comprising a blocking plate covering the first inlet and the exhaust opening, the blocking plate configured to redirect the processing fluid from the first inlet towards a sidewall of the processing chamber, and wherein the blocking plate is coaxial with the processing chamber, the first inlet, and the exhaust opening and is placed at a level between a level of a bottom surface of the processing chamber and a level of the substrate support.

12. The substrate processing apparatus of claim 1, wherein an outer diameter of the first portion of the first supply pipe is less than an inner diameter of the exhaust pipe, and
   the processing fluid contains carbon dioxide.

13. A substrate processing apparatus comprising:
   a processing chamber including a processing space, the processing chamber having a bottom wall with a mounting hole disposed at a center thereof;
   a substrate support configured to support a substrate in the processing chamber;
   a first supply pipe arranged inside the mounting hole and including a first inlet configured to inject a processing fluid in a supercritical state upward toward the center of the processing space;
   an exhaust pipe including an exhaust opening arranged inside the mounting hole and configured to exhaust a fluid from the processing space; and
   a blocking plate disposed over the first inlet and the exhaust opening, the blocking plate configured to redirect the processing fluid to a sidewall of the processing chamber,
   wherein the first inlet and the exhaust opening are spaced apart from one another,
   wherein the first inlet and the exhaust opening are coaxial with a central axis of the processing chamber.

14. The substrate processing apparatus of claim 13, wherein, in a plan view, a center of the first inlet is inside the exhaust opening formed at an end of the exhaust pipe, and
   in a plan view, a center of the exhaust opening is inside the first inlet.

15. The substrate processing apparatus of claim 13, further comprising a second supply pipe arranged in an upper mounting hole of an upper wall of the processing chamber, and including a second inlet configured to inject the processing fluid into the processing space,
   wherein the second inlet vertically overlaps the first inlet and the exhaust opening.

16. The substrate processing apparatus of claim 15, wherein a center of the first inlet, a center of the exhaust opening, and a center of the second inlet are aligned along the central axis of the processing chamber.

17. The substrate processing apparatus of claim 13, wherein the exhaust pipe comprises a first portion disposed within the first supply pipe and a second portion outside the first supply pipe, and
   an outer diameter of the first portion of the exhaust pipe is less than an inner diameter of the first supply pipe.

18. A substrate processing method comprising:
   loading a substrate into a processing space of a processing chamber to align a central axis of the substrate with a central axis of the processing chamber;

supplying a processing fluid in a supercritical state into the processing chamber towards a bottom surface of the substrate via a first supply pipe that is coaxial with the central axis of the substrate and that is provided in a bottom wall of the processing chamber, the first supply pipe having a first inlet below a blocking plate positioned between the substrate and the bottom wall;

redirecting the processing fluid towards a sidewall of the processing chamber with the blocking plate; and exhausting a fluid from a lower end of the processing chamber via an exhaust pipe having an exhaust opening coaxial with the central axis of the substrate and that is provided on the bottom wall of the processing chamber, wherein the first inlet and the exhaust opening are spaced apart from one another, and wherein the first supply pipe comprises a first portion disposed within the exhaust pipe and a second portion outside the exhaust pipe.

19. The substrate processing method of claim 18, further comprising supplying the processing fluid in the supercritical state into the processing chamber towards an upper surface of the substrate via a second supply pipe coaxial with the central axis of the substrate and that is provided in an upper wall of the processing chamber, wherein the processing fluid supplied towards the upper surface of the substrate is supplied at a higher temperature than the processing fluid supplied towards the bottom surface of the substrate.

20. The substrate processing apparatus of claim 1, wherein a center of the first inlet at an end portion of the first supply pipe at the bottom wall of the processing chamber, and a center of the exhaust opening at an end portion of the exhaust pipe are aligned with a central axis of the processing chamber.

* * * * *